(12) United States Patent
Ishida et al.

(10) Patent No.: US 6,657,412 B2
(45) Date of Patent: Dec. 2, 2003

(54) PULSE WIDTH MODULATION METHOD, PULSE WIDTH MODULATOR AND POWER CONVERTER

(75) Inventors: Seiji Ishida, Hitachi (JP); Keijiro Sakai, Kuji (JP); Toshiaki Okuyama, Naka (JP); Hiroshi Fujii, Chiba (JP); Hiroyuki Tomita, Funabashi (JP); Tatsuo Ando, Shimizu (JP); Yuhachi Takakura, Oyama (JP); Hideo Kimura, Takahagi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/941,873

(22) Filed: Aug. 30, 2001

(65) Prior Publication Data

US 2002/0093391 A1 Jul. 18, 2002

(30) Foreign Application Priority Data

Oct. 3, 2000 (JP) ........................................ 2000-304005

(51) Int. Cl.[7] .............................................. G05B 11/28
(52) U.S. Cl. ........................ 318/599; 318/811; 388/804
(58) Field of Search ................................. 318/599, 811; 363/41, 43; 323/283; 322/28; 332/109; 388/804

(56) References Cited

U.S. PATENT DOCUMENTS 5,594,631 A * 1/1997 Katoozi et al. ............... 363/41
5,637,986 A * 6/1997 Kanazawa et al. ............ 322/28

FOREIGN PATENT DOCUMENTS

JP   A-04-236171   8/1992
JP   A-06-153526   5/1994

* cited by examiner

*Primary Examiner*—Karen Masih
(74) *Attorney, Agent, or Firm*—Antonelli, Terry, Stout & Kraus, LLP

(57) ABSTRACT

In detecting an output current of a power converter based on a DC current Idc of the power converter, the pulse width of the DC current Idc becomes narrower when the pulse width of a line voltage is narrower, and its detection becomes difficult. A voltage command correction unit 9 according to the present invention corrects voltage commands such that pulse width of a line voltage becomes zero when the pulse width of the line voltage is less than the minimum pulse width, not to output a line pulse, and an error generated by the correction is integrated. This integrated error is added to the line voltage in the next time, and the integrated pulse width of the line voltage is outputted when the pulse width becomes larger than or equal to the minimum pulse width.

18 Claims, 24 Drawing Sheets

PULSE WIDTH MODULATION METHOD, PULSE WIDTH MODULATOR AND POWER CONVERTER

BACKGROUND OF THE INVENTION

The present invention relates to a pulse width modulation system, and in particular, to a pulse width modulation system for controlling a power converter.

FIG. 18 shows an example of a power converter using a pulse width modulation system. In FIG. 18, the reference numeral 1 refers to AC power supply, 2 to a rectifier circuit, 3 to a smoothing capacitor, 4 to a motor, 5 to a current detector, 6 to a PWM control unit, 7 to a current detection unit, 8 to a motor control unit, Qu, Qv, Qw, Qx, Qy and Qz to switching elements, and 10 to the power converter. Voltage supplied from the AC power supply 1 is rectified by the rectifier circuit 2, and further, smoothed by the smoothing capacitor 3, to be converted to DC voltage. By switching the switching elements Qu, Qv, Qw, Qx, Qy and Qz, the DC voltage is converted to a U-phase voltage, a V-phase voltage and a W-phase voltage connected to the motor 4.

Further, the current detector 5 detects a DC current Idc that flows from the switching elements Qx, Qy and Qz to the smoothing capacitor 3. And, the current detection unit 7 detects a U-phase motor current Iu, a V-phase motor current Iv and a W-phase motor current Iw based on the DC current Idc detected by the current detector 5 and from gate signals Gu, Gv, Gw, Gx, Gy and Gz outputted by the PWM control unit 6.

Based on the detected motor currents Iu, Iv and Iw and a speed command Fr* given from the outside, the motor control unit 8 outputs a U-phase AC voltage command Eu, a V-phase AC voltage command Ev, and a W-phase AC voltage command Ew. And, based on the AC voltage commands Eu, Ev and Ew, the PWM control unit 6 outputs the gate signals Gu, Gv, Gw, Gx, Gy and Gz that instruct respective switching elements Qu, Qv, Qw, Qx, Qy and Qz. Here, the power converter 10 comprises the rectifier circuit 2, the smoothing capacitor 3, the current detector 5, the PWM control unit 6, the current detection unit 7, the motor control unit 8, and the switching elements Qu, Qv, Qw, Qx, Qy and Qz.

FIG. 19 shows a configuration of the PWM control unit 6. The PWM control unit 6 comprises a carrier generation unit 601, a U-phase comparing unit 602, a V-phase comparing unit 603, a W-phase comparing unit 604, and reversing units 605, 606 and 607. The carrier generation unit 601 outputs a carrier C as a triangular wave of a frequency Fc, based on a carrier frequency command Fc. The U-phase comparing unit 602, which outputs the gate signal Gu, compares the U-phase AC voltage command Eu with the carrier C, and outputs an H level when the U-phase AC voltage command Eu is larger, and outputs an L level when smaller. Further, the reversing unit 605, which outputs the gate signal Gx, outputs the H level when the gate signal Gu is L level, and outputs the L level when the gate signal Gu is H level. Similarly, the V-phase comparing unit 603, which outputs the gate signal Gv, compares the V-phase AC voltage command Ev with the carrier C, and outputs the H level when the V-phase AC voltage command Ev is larger, and outputs L level when smaller. Further, the reversing unit 606, which outputs the gate signal Gy, outputs the H level when the gate signal Gv is L level, and outputs the L level when the gate signal Gv is H level. Further, the W-phase comparing unit 604, which outputs the gate signal Gw, compares the W-phase AC voltage command Ew with the carrier C, and outputs the H level when the W-phase AC voltage command Ew is larger and L level when smaller. Further, the reversing unit 607, which outputs the gate signal Gz, outputs the H level when the gate signal Gw is L level and outputs the L level when the gate signal Gw is H level.

Next, operation of the PWM control unit 6 will be described. FIG. 20 is a waveform chart for various parts including the PWM control unit, and its horizontal axis is a time axis. Each waveform will be described in turn from the top. In FIG. 20, (a) shows waveforms of the AC voltage commands Eu, Ev and Ew and a waveform of the carrier C for pulse width modulation of the AC voltage commands Eu, Ev and Ew.

In FIG. 20, (b) shows a waveform of the gate signal Gu obtained by comparing the U-phase AC voltage command Eu with the carrier C. The waveform becomes H level when the U-phase AC voltage command Eu is larger than the carrier C, and becomes L level when the U-phase AC voltage command Eu is smaller than the carrier C. When the gate signal Gu is H level, the gate signal Gx becomes L level, and at that time, the switching element Qu becomes on and the switching element Qx becomes off. On the other hand, when the gate signal Gu is L level, the gate signal Gx becomes H level, and at that time, the switching element Qu becomes off and the switching element Qx becomes on.

In FIG. 20, (c) shows a waveform of the gate signal Gv that is obtained by comparing the V-phase AC voltage command Ev with the carrier C. That waveform becomes H level when the V-phase AC voltage command Ev is larger than the carrier C, and becomes L level when the V-phase AC voltage command Ev is smaller than the carrier C. A relation between the gate signals Gv and Gy, and operations of the switching elements Qv and Qy are similar to the relation between the gate signals Gu and Gx and the operation of the switching elements Qu and Qx, respectively.

In FIG. 20, (d) shows a waveform of the gate signal Gw that is obtained by comparing the W-phase AC voltage command Ew and the carrier C. The waveform becomes H level when the W-phase AC voltage command Ew is larger than the carrier C, and becomes L level when the W-phase AC voltage command Ew is smaller than the carrier C. A relation between the gate signals Gw and Gz, and operation of the switching elements Qw and Qz are similar to the relation between the gate signals Gu and Gx and the operation of the switching elements Qu and Qx, respectively.

In FIG. 20, (e) shows a waveform of a line voltage Vuv between a U-phase output to which the switching element Qu is connected and a V-phase output to which the switching element Qv is connected, out of line voltages as outputs of the power converter.

In FIG. 20, (f) shows waveforms of currents that flow from the power converter 10 to the motor 4. Here, the symbol Iu refers to the U-phase motor current, Iv to the V-phase motor current, and Iw to the W-phase motor current. The U-phase motor current Iv, the V-phase motor current Iv and the W-phase motor current Iw correspond to the U-phase output to which the switching element Qu is connected, the V-phase output to which the switching element Qv is connected, and the W-phase output to which the switching element Qw is connected, respectively.

In FIG. 20, (g) shows a waveform of the DC current Idc. By turning on and off the switching elements, based on the gate signals, the outputs of the power converter, i.e., the U-phase voltage, the V-phase voltage and the W-phase voltage with respect to the lower terminal (cathode) of the smoothing capacitor 3 have waveforms similar to the gate signals Gu, Gv and Gw, respectively. As a result, the line voltage Vuv of the motor becomes the voltage shown in the figure. As described above, the PWM control unit 6 outputs the gate signals Gu, Gv and Gw, by comparing the carrier C with the AC voltage commands Eu, Ev and Ew, respectively.

Next, referring to FIG. 21, a method of detecting the motor currents Iu, Iv and Iw in the current detection unit 7 will be described.

FIG. 21 shows details of the period T1 in FIG. 20. In FIG. 21, the horizontal axis indicates time, and the vertical axis indicates the gate signal Gu, the gate signal Gv, the gate signal Gw, the line voltage Vuv, a line voltage Vvw between the V-phase output and the W-phase output, a line voltage Vwu between the W-phase output and the V-phase output, and the DC current Idc, in turn from the top. As shown in FIG. 20, the sign of the V-phase motor current Iv is plus, and the signs of the U-phase motor current Iu and the W-phase motor current Iw are minus.

In the period Ta, all the gate signals Gu, Gv and Gw are L level, and thus, the switching elements Qu, Qv and Qw are off, and the switching elements Qx, Qy and the Qz are on. Accordingly, the current flowing to the motor 4 flows from the switching element Qy through the V-phase output to the motor 4, and flows from the motor 4 through the U-phase output and W-phase output to the switching elements Qx and Qz, respectively, to return to the switching element Qy. Thus, current does not flow to the current detector 5, and Idc is zero.

In the period Tb, the gate signal Gv is H level and the gate signals Gu and Gw are L level, and thus, the switching elements Qx, Qv and Qz are on, and the switching elements Qu, Qy and Qw are off. Accordingly, the current flowing to the motor 4 flows from the upper terminal (anode) of the smoothing capacitor 3 through the switching elements Qv and the V-phase output to the motor 4, and flows from the motor 4 through the U-phase output and W-phase output to the switching elements Qx and Qz respectively, to the cathode of the smoothing capacitor 3. Accordingly, current having the same strength and sign as the current Iv flows to the current detector 5.

In the period Tc, the gate signals Gv and Gw are H level and the gate signal Gu is L level, and thus, the switching elements Qx, Qv and Qw are on and the switching elements Qu, Qy and Qz are off. Accordingly, the current flows from the anode of the smoothing capacitor 3 through the switching element Qv and the V-phase output to the motor 4, and at the same time, through the switching element Qw and the W-phase output to the motor 4. Further, the current that has flowed to the motor 4 flows from the motor 4 through the U-phase output and the switching element Qx, to the cathode of the smoothing capacitor 3. Accordingly, current having the same strength as and the opposite sign to the current Iu flows to the current detector 5.

In the period Td, all the gate signals Gu, Gv and Gw are H level, and thus, the switching elements Qu, Qv and Qw are on and the switching elements Qx, Qy and Qz are off. Accordingly, the current flowing to the motor 4 flows from the switching element Qv through the V-phase output to the motor 4, and flows from the motor 4 through the U-phase output and W-phase output to the switching elements Qu and Qw respectively, to return to the switching element Qv. Thus, current does not flow to the current detector 5, and Idc is zero.

In the period Te, the state of the gate signals is same as the period Tc, and accordingly, current having the same strength as and the opposite sign to the current Iu flows to the current detector 5. In the period Tf, the state of the gate signals is same as the period Tb, and accordingly, current having the same strength and sign as the current Iv flows to the current detector 5. In the period Tg, the state of the gate signals is same as the period Ta, and accordingly, current does not flow to the current detector 5.

The current detection unit 7 detects current synchronously with the gate signals. For example, operation of the current detection unit 7 in the period T1 is as follows. Namely, in the period Tb or Tf, the DC current Idc as the output of the current detector 5 is sampled to detect the V-phase motor current Iv. In the period Tc or Te, by sampling the DC current Idc as the output of the current detector 5 and by reversing the sign, the U-phase motor current Iu is detected. Further, since the sum total of the currents flowing from the power converter to the motor is zero, the W-phase motor current Iw is obtained by the following equation (1):

$$Iw=-(Iu+Iv)$$ Eq. (1)

Although kinds of currents that can be detected differ depending on a combination of the gate signals, two motor currents can be detected out of the three motor currents. And, the remaining current can be easily obtained from the fact that the sum total of the currents is zero.

As techniques relating to this kind of apparatus, Japanese Unexamined Patent Laid-Open Nos. 6-153526 and 4-236171 are known, for example.

Among the waveforms shown in FIG. 20, ones in the period T2 are enlargedly shown in FIG. 22. The horizontal and vertical axes of the waveforms shown in FIG. 22 are same as the FIG. 21. Here, we note the periods Tj and Tl. In the periods Tj and Tl, the gate signals Gv and Gw are H level, and the gate signal Gu is L level. Thus, the switching elements Qx, Qv and Qw are on, and the switching elements Qu, Qy and Qz are off.

Current flows from the anode of the smoothing capacitor 3 through the switching element Qv and the V-phase output to the motor 4, and at the same time, through the switching element Qw and the W-phase output to the motor 4. The current that has flowed to the motor 4 flows from the motor 4 through the U-phase output and the switching element Qx, to the cathode of the smoothing capacitor 3. Accordingly, current having the same strength as and the opposite sign to the current Iu flows to the current detector 5. Thus, when the DC current Idc is detected by the current detector 7 in the periord Tj or Tl, the current Iu can be detected.

Although FIG. 22 shows ideal waveforms that rise instantaneously, current has a rise delay time actually. In some cases, overshoot occurs in the DC current Idc. Accordingly, when a period is short such as the periods Tj and Tl, it is difficult to sample correct current values.

As seen from FIG. 22, a sampling period becomes short when a pulse width of a line voltage becomes narrow. Namely, when a line voltage is low, and when the frequency of the carrier is high, sampling becomes difficult. When the frequency of the carrier is smallered in order to ensure a sufficient sampling period, then, motor control performance reduces and magnetic sound from the motor increases.

Hereinabove, the most general three-phase case has been taken as an example. However, the same applies to the single-phase case or multi-phase case of more than three phases, too. In the case of the single phase, there are four gate signals as the outputs of the PWM control unit, and two are in reversed relation to the other two.

FIG. 23 shows waveforms of two gate signals and the DC current. Two gate signals obtained by reversing are omitted.

Similarly to the three-phase case, when a difference between the gate signals is narrow in width, pulse width of the DC current becomes narrow and its detection becomes difficult.

Further, in the case of multi-phase of more than three phases, for example, five phases, the number of the gate signals is ten, and five is in reversed relation to the other five. FIG. 24 shows waveforms of five gate signals except for the other five obtained by reversing, and of the DC current. In this case too, similarly to the three-phase case, when width of a difference between gate signals is narrow, pulse width of the DC current becomes narrow, and its detection becomes difficult.

According to the principle of the pulse width modulation, when a difference between AC voltage commands as modulated waves becomes smaller, i.e., a line voltage is smaller, width of a difference between gate signals becomes narrower as in the above.

SUMMARY OF THE INVENTION

To solve the above problems, the present invention provides a method of pulse width modulation of a plurality of signals, wherein: said plurality of signals are corrected such that widths of pulses obtained based on a signal difference of each two signals out of said plurality of signals become larger than or equal to a predetermined value given in advance.

The said signal difference is obtained by adding an integrated error to a difference between said two signals; and at the same time, when said signal difference is less than said predetermined value, at least one of said two signals is corrected such that the difference between said two signals becomes zero or less than said signal difference; and when said signal difference is larger than or equal to the predetermined value, at least one of said two signals is corrected such that the difference between said two signals becomes said signal difference.

By this, when the signal difference is less than the predetermined value, the signal difference is corrected to be larger than or equal to the predetermined value. Thus, by modulating the corrected signals, it is ensured that the pulse width as a result of modulation is larger than or equal to a predetermined value. Further, when, in obtaining the integrated error, the signal difference is less than the predetermined value, the signal difference becomes zero and the integrated error increases. The signal difference increases as the integrated error increases, and thus, the signal difference becomes larger than or equal to the predetermined value in the course of time, and at that time the pulse width modulation is performed.

Further, the present invention provides a method of performing pulse width modulation on a plurality of signals, using a carrier, wherein: signal differences, each of which is a difference between two signals out of said plurality of signals, are obtained; and when at least one of said signal differences lies in a neighborhood of zero, a frequency of said carrier is lowered.

By this, in an area where the pulse width of a difference between pulses as the results of the modulation becomes smaller if the present invention is not applied, the carrier frequency becomes lower. When the carrier frequency becomes lower, the pulse width becomes wider, and the required pulse width can be ensured.

Further, the present invention provides a power converter to which each of the above-described methods of performing the pulse width modulation is applied, with voltage commands being inputted as signals, and with output pulses serving as output voltages. By this, it is possible to ensure the required pulse width of the line voltage as a difference between output voltages.

DESCRIPTION OF THE PREFERRED EMBODIMENTS

In the following, embodiments of the present invention will be described referring to the attached drawings.

To begin with, a first embodiment of the present invention will be described.

Figure 1:
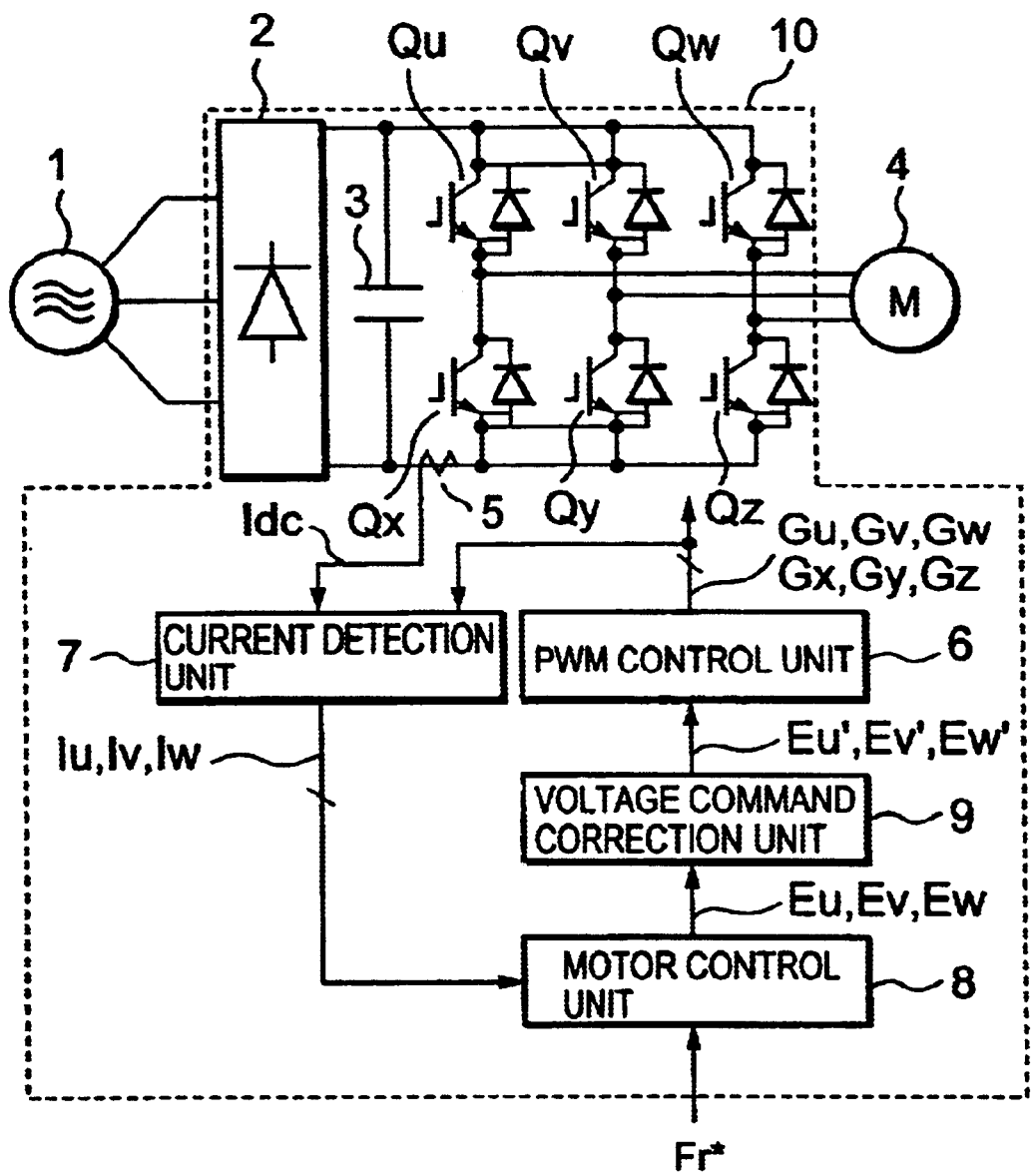
FIG. 1 is a schematic diagram showing a power converter according to a first embodiment of the present invention.
Figure 18:
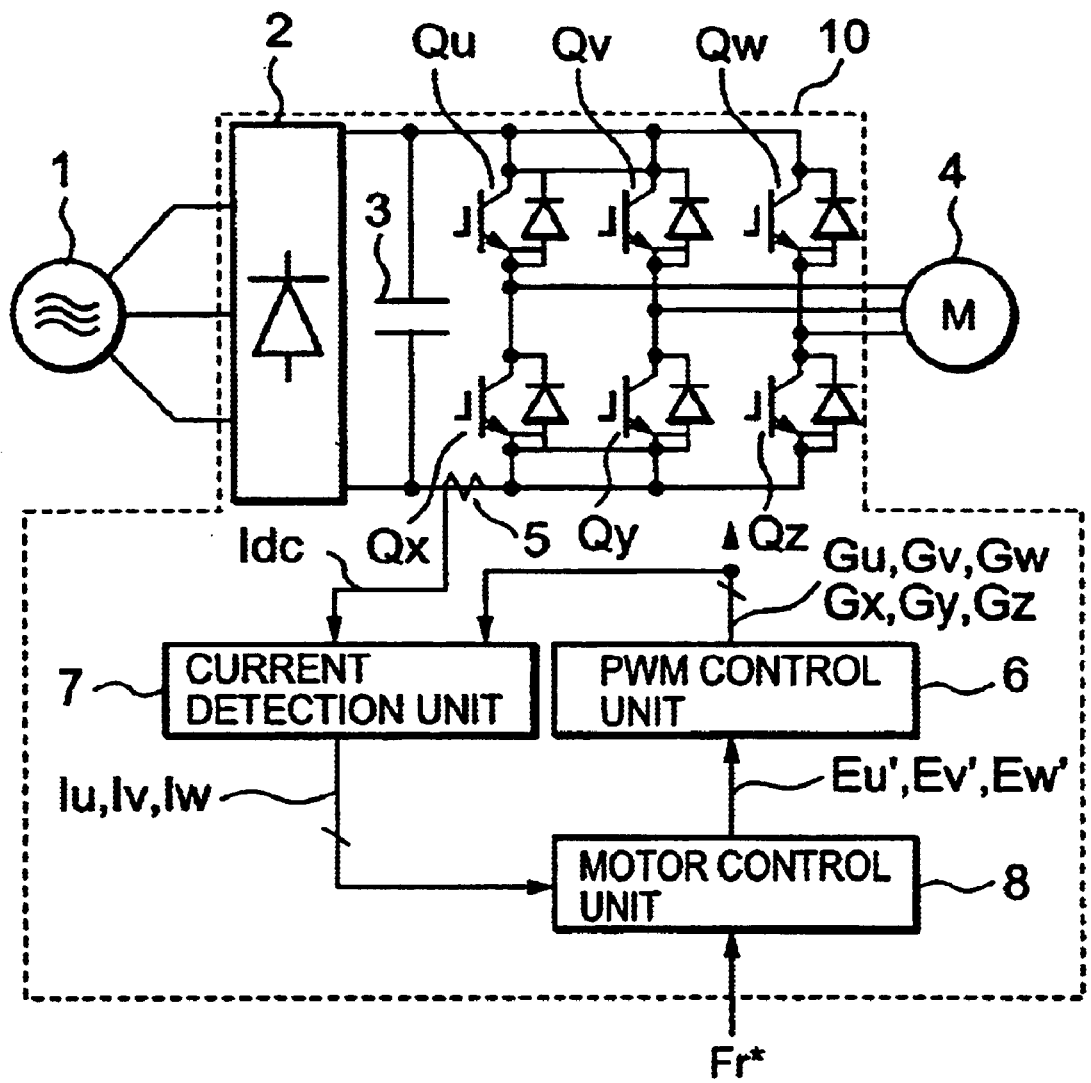
FIG. 18 is a schematic diagram showing an ordinary power converter.

FIG. 1 shows a configuration of a power converter according to the first embodiment. Here, like numerals refer to like components in the FIG. 1 and the above-described FIG. 18, and their explanation is omitted.

In FIG. 1, a voltage command correction unit 9 corrects voltage commands Eu, Ev and Ew outputted by a motor control unit 8, and outputs the after-correction voltage commands Eu', Ev' and Ew'. Based on the after-correction voltage command Eu', Ev' and Ew', a PWM control unit 6 outputs gate signals Gu, Gv, Gw, Gx, Gy and Gz. The processing in the voltage command correction unit 9 is performed in a predetermined cycle.

When a line voltage which is a difference between voltage commands as inputs to the voltage command correction unit 9, is smaller than a voltage (hereinafter, referred to as minimum pulse width) corresponding to a predetermined minimum pulse width, the voltage command correction unit 9 outputs the after-correction line voltage commands such that the line voltage becomes zero. Further, an error, which is caused by the correction, between the line voltages in the inputs and outputs of the voltage command correction unit 9 is integrated. The integrated line voltage error is added to the line voltage of the voltage commands inputted to the voltage command correction unit 9 in the next processing. By this, the integrated error of the line voltage does not become larger than the minimum pulse width.

Further, since the motor 4 has an inductance component, the harmonic component is removed. Thus, when an integrated error of a line voltage is held in the neighborhood of zero, no problem occurs in driving the motor 4.

Figure 2:
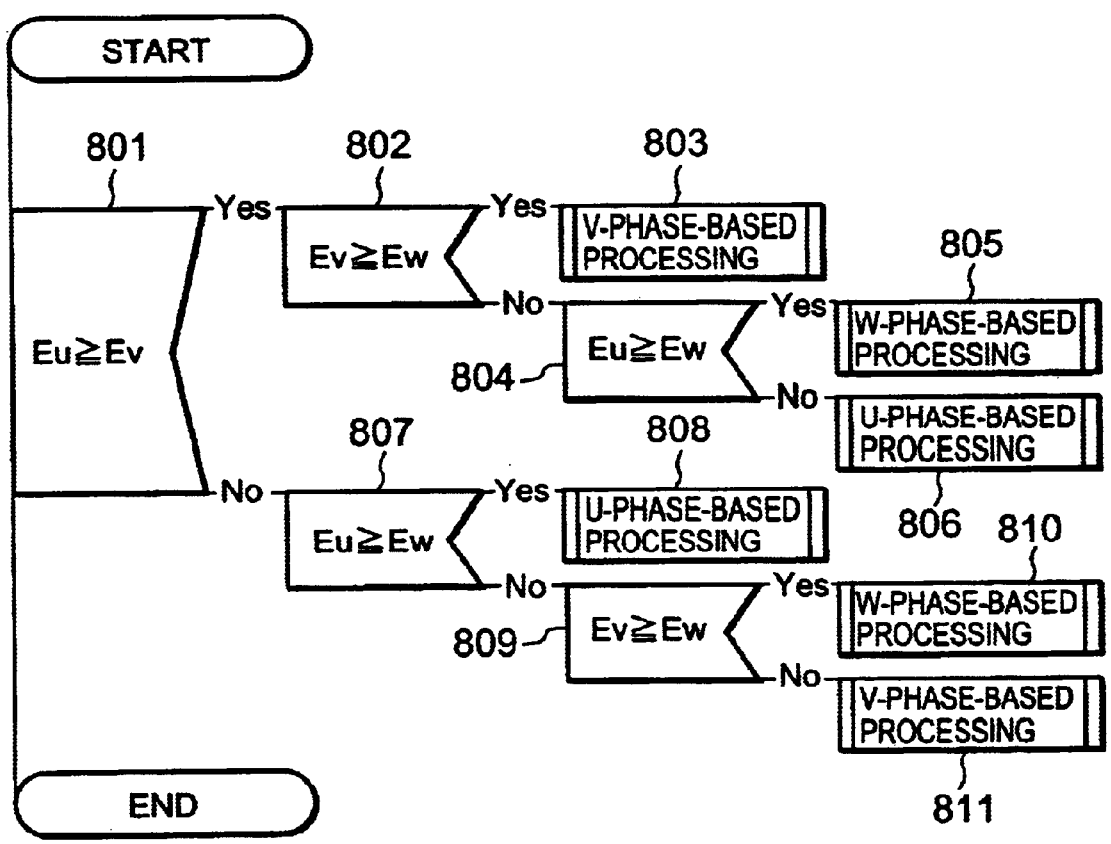
FIG. 2 is a flowchart showing operation of a voltage command correction unit according to the first embodiment of the present invention.

Next, operation of the voltage command correction unit 9, which is a characteristic part of the present embodiment, will be described referring to FIGS. 2–5. FIG. 2 is a flowchart showing the whole processing performed in the voltage command correction unit 9.

First, the voltage command correction unit 9 performs the processing 801. In this processing 801, the voltage command correction unit 9 compares the voltage commands Eu and Ev. As a result, when the voltage command Eu is larger than or equal to the voltage command Ev, the voltage command correction unit 9 performs the processing 901, and when the voltage command Eu is smaller than the voltage command Ev, it performs the processing 807.

In the processing 802, the voltage command correction unit 9 compares the voltage commands Ev and Ew. As a result, when the voltage command Ev is larger than or equal to the voltage command Ew, the voltage command correction unit 9 performs the processing 803, and when the voltage command Ev is smaller than the voltage command Ew, then, it performs the processing 804.

In the processing 803, the voltage command correction unit 9 performs the V-phase-based processing described below.

In the processing 804, the voltage command correction unit 9 compares the voltage commands Eu and Ew. As a result, when the voltage command Eu is larger than or equal to the voltage command Ew, the voltage command correction unit 9 performs the processing 805, and when the voltage command Eu is smaller than the voltage command Ew, it performs the processing 806. In the processing 805, the voltage command correction unit 9 performs the W-phase-based processing described below, and in the processing 806, it performs the U-phase-based processing described below.

On the other hand, in the processing 807, the voltage command correction unit 9 compares the voltage commands Eu and Ew. As a result, when the voltage command Eu is larger than or equal to the voltage command Ew, the voltage command correction unit 9 performs the processing 808, and when the voltage command Eu is smaller than the voltage command Ew, it performs the processing 809.

In the processing 808, the voltage command correction unit 9 performs the U-phase-based processing described below.

In the processing 809, the voltage command correction unit 9 compares the voltage commands Ev and Ew. As a result, when the voltage command Ev is larger than or equal to the voltage command Ew, the processing 810 is performed, and when the voltage command Ev is smaller than the voltage command Ew, the processing 811 is performed. In the processing 810, the voltage command correction unit 9 performs the W-phase-based processing described below, and in the processing 811, it performs the V-phase-based processing described below.

The above-described processing leads to the below-described processing based on a voltage command of the median value among the voltage commands.

Now, the U-phase-based processing will be described.

Figure 3:
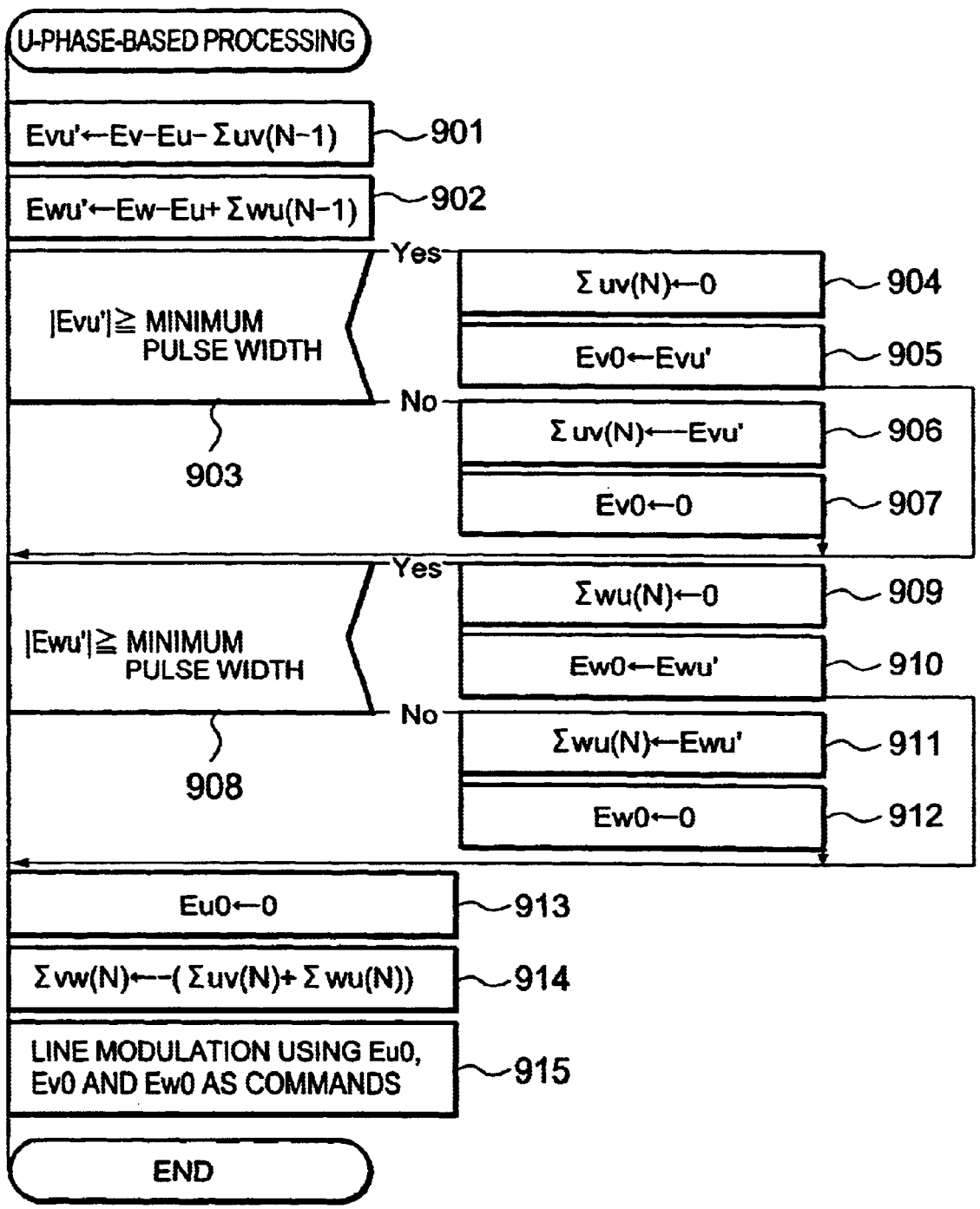
FIG. 3 is a flowchart showing U-phase-based processing as a part of the operation of the voltage command correction unit.

FIG. 3 is a flowchart showing the U-phase-based processing. In this U-phase-based processing, the voltage command correction unit 9 performs the processing 901, first. In the processing 901, the voltage command correction unit 9 subtracts the voltage command Eu and the integrated U-V line voltage error Σuv(N−1) calculated in the previous processing, from the voltage command Ev, to obtain U-V line voltage command Evu'. Here, the integrate U-V line voltage error Σuv(N−1) is subtracted, since the U-V line voltage command Evu' is a quantity based on the U phase, while the integrated U-V line voltage error Σuv(N−1) is a quantity based on the V phase.

Next, in the processing 902, the voltage command correction unit 9 subtracts the voltage command Eu from the voltage command Ew, and further adds the integrated W-U line voltage error Σwu(N−1) calculated in the previous processing, to obtain the W-U line voltage command Ewu'.

Next, in the processing 903, the voltage command correction unit 9 compares the absolute value of the V-U line voltage command Evu' calculated in the processing 901 with the predetermined minimum pulse width. As a result, when the absolute value of the V-U line voltage command Evu' is larger than or equal to the minimum pulse width, the voltage command correction unit 9 performs the processing 904. On the other hand, when the absolute value of the V-U line voltage command Evu' is less than the minimum pulse width, it performs the processing 906.

In the processing 904, the voltage command correction unit 9 stores zero to the integrated U-V line voltage error Σuv(N) used in the next processing. Thereafter, in the processing 905, the voltage command correction unit 9 sets the after-correction voltage command Ev0 to the V-U line voltage command Evu' calculated in the processing 901, and performs the processing 908.

On the other hand, in the processing 906, the voltage command correction part 9 reverses the sign of the V-U line voltage command Evu' calculated in the processing 901, and stores the obtained value −Evu' to the integrated U-V line voltage error Σuv(N) used in the next processing. Here, the sign of the V-U line voltage command Evu' is reversed since the V-U line voltage command Evu' is a value based on the U phase, while the integrated U-V line voltage error Σuv(N) is a value based on the V phase. Thereafter, in the processing 907, the voltage command correction unit 9 sets the after-correction voltage command Ev0 to zero, and performs the processing 908.

In the processing 908, the voltage command correction unit 9 compares the W-U line voltage command Ewu' calculated in the processing 902 with the predetermined minimum pulse width. As a result, when the absolute value of the W-U line voltage command Ewu' is larger than or equal to the minimum pulse width, the voltage command correction unit 9 performs the processing 909, and when the absolute value of the W-U line voltage command Ewu' is less than the minimum pulse width, it performs the processing 911.

In the processing 909, the voltage command correction unit 9 stores zero to the integrated W-U line voltage error Σwu(N) used in the next processing. Thereafter, in the processing 910, the voltage command correction unit 9 sets the after-correction voltage command Ew0 to the absolute value of the W-U line voltage command Ewu', and performs the processing 913.

On the other hand, in the processing 911, the voltage command correction unit 9 stores the W-U line voltage command Ewu' calculated in the processing 902 to the integrated W-U line voltage error Σwu(N) used in the next processing. Thereafter, in the processing 912, the voltage command correction unit 9 sets the after-correction voltage command Ew0 to zero, and performs the processing 913.

In the processing 913, the voltage command correction unit 9 sets the after-correction voltage command Eu0 to zero. Further, in the processing 914, the voltage command correction unit 9 obtains the sum of the integrated U-V line voltage error Σuv(N) and the integrated W-U line voltage error Σwu(N), reverses the sign of the sum, and stores the result to the integrated V-W line voltage error Σvw(N) used in the next processing.

Then, in the processing 915, the voltage command correction unit 9 performs line modulation on the after-correction voltage commands Eu0, Ev0 and Ew0 of respective phases obtained in the above processing, to calculates the outputs Eu', Ev' and Ew' of the voltage command correction unit 9. In the following, actual equations (2), (3) and (4) used for this line modulation are shown.

$$Eu' = Eu0 - \{\text{Max}(Eu0, Ev0, Ew0) + \text{Min}(Eu0, Ev0, Ew0)\} \div 2 \quad \text{Eq. (2)}$$

$$Ev' = Ev0 - \{\text{Max}(Eu0, Ev0, Ew0) + \text{Min}(Eu0, Ev0, Ew0)\} \div 2 \quad \text{Eq. (3)}$$

$$Ew' = Ew0 - \{\text{Max}(Eu0, Ev0, Ew0) + \text{Min}(Eu0, Ev0, Ew0)\} \div 2 \quad \text{Eq. (4)}$$

Here, the function Max used in these equations (2), (3) and (4) is a function that returns the maximum value among the values in the parentheses, and the function Min is a function that returns the minimum value among the values in the parentheses. For example, Max(2, 5, −7) returns 5, and Min(2, 5, −7) returns −7.

By this, a line voltage becomes larger than or equal to the minimum pulse width, and on average, each line voltage is same before and after the correction.

Next, the V-phase-based processing will be described.

Figure 4:
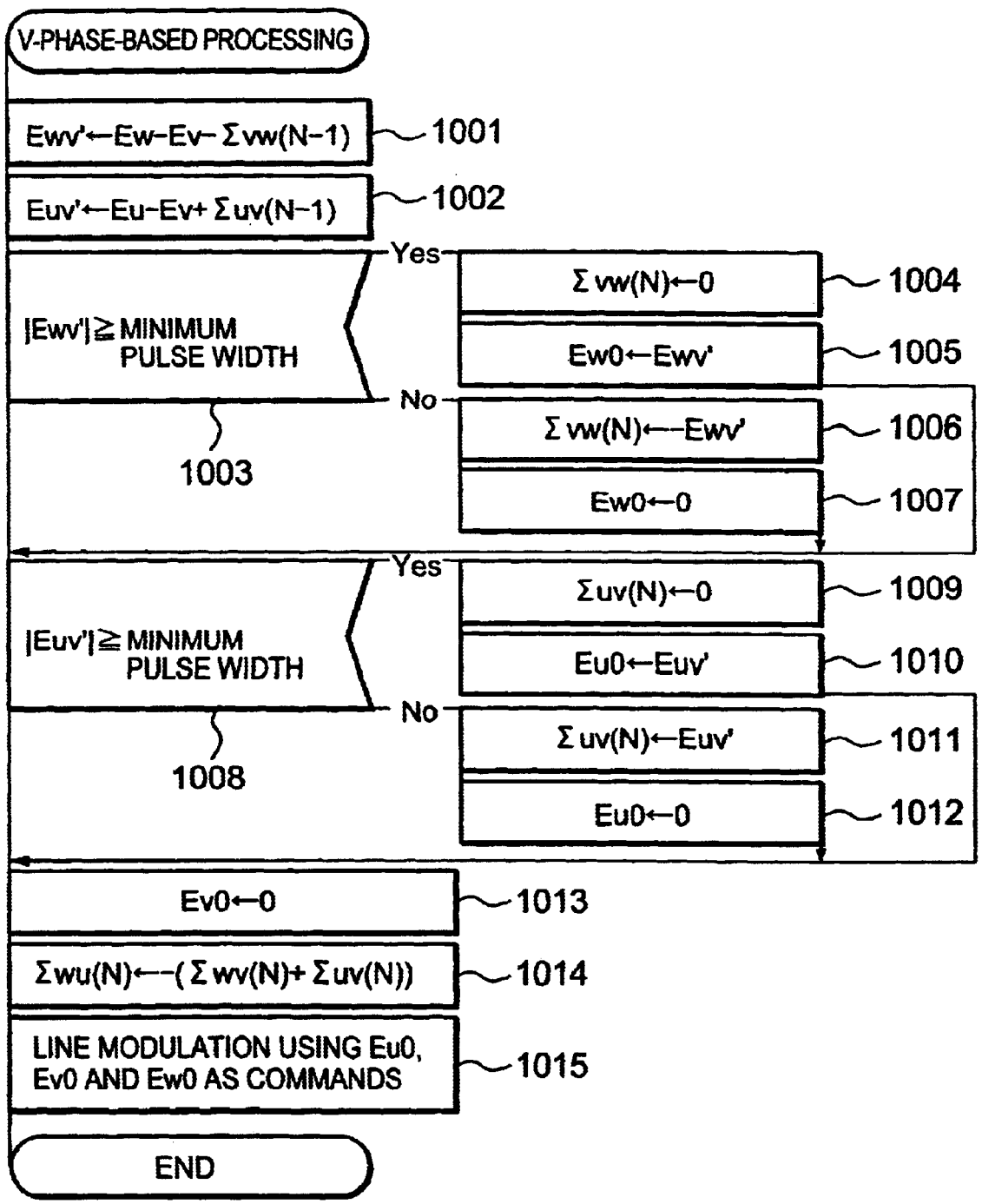
FIG. 4 is a flowchart showing V-phase-based processing as a part of the operation of the voltage command correction unit.

FIG. 4 is a flowchart showing the V-phase-based processing. In this V-phase-based processing, U, V and W in the P-phase-based processing are interchanged with V, W and U, respectively. In detail, the voltage command Ev is used instead of the voltage command Eu in the U-phase-based processing; the voltage command Ew instead of the voltage command Ev in the U-phase-based processing; the voltage command Eu instead of the voltage command Ew in the U-phase-based processing; the integrated V-W line voltage error Σvw(N−1) calculated in the previous processing instead of the integrated U-V line voltage error Σuv(N−1) calculated in the previous processing in the U-phase-based processing; the integrated U-V line voltage error Σuv(N−1) calculated in the previous processing instead of the integrated W-U line voltage error Σwu(N−1) calculated in the previous processing used in the U-phase-based processing; the W-V line voltage command Ewv' instead of the V-U line voltage command Evu' in the U-phase-based processing; the U-V line voltage command Euv' instead of the W-U line voltage command Ewu' in the U-phase-based processing; the integrated V-W line voltage error Σvw(N) instead of the integrated U-V line voltage error Σuv(N) in the U-phase-based processing; the integrated U-V line voltage error Σuv(N) instead of the integrated W-U line voltage error Σwu(N) in the U-phase-based processing; the integrated W-U line voltage error Σwu(N) instead of the integrated V-W line voltage error Σvw(N) in the U-phase-based processing; the after-correction voltage command Ew0 instead of the after-correction voltage command Ev0 in the U-phase processing; the after-correction voltage command Eu0 instead of the after-correction voltage command Ew0 in the U-phase-based processing; and the after-correction voltage command Ev0 instead of the after-correction voltage command Eu0 in the U-phase-based processing.

Next, the W-phase-based processing will be described.

Figure 5:
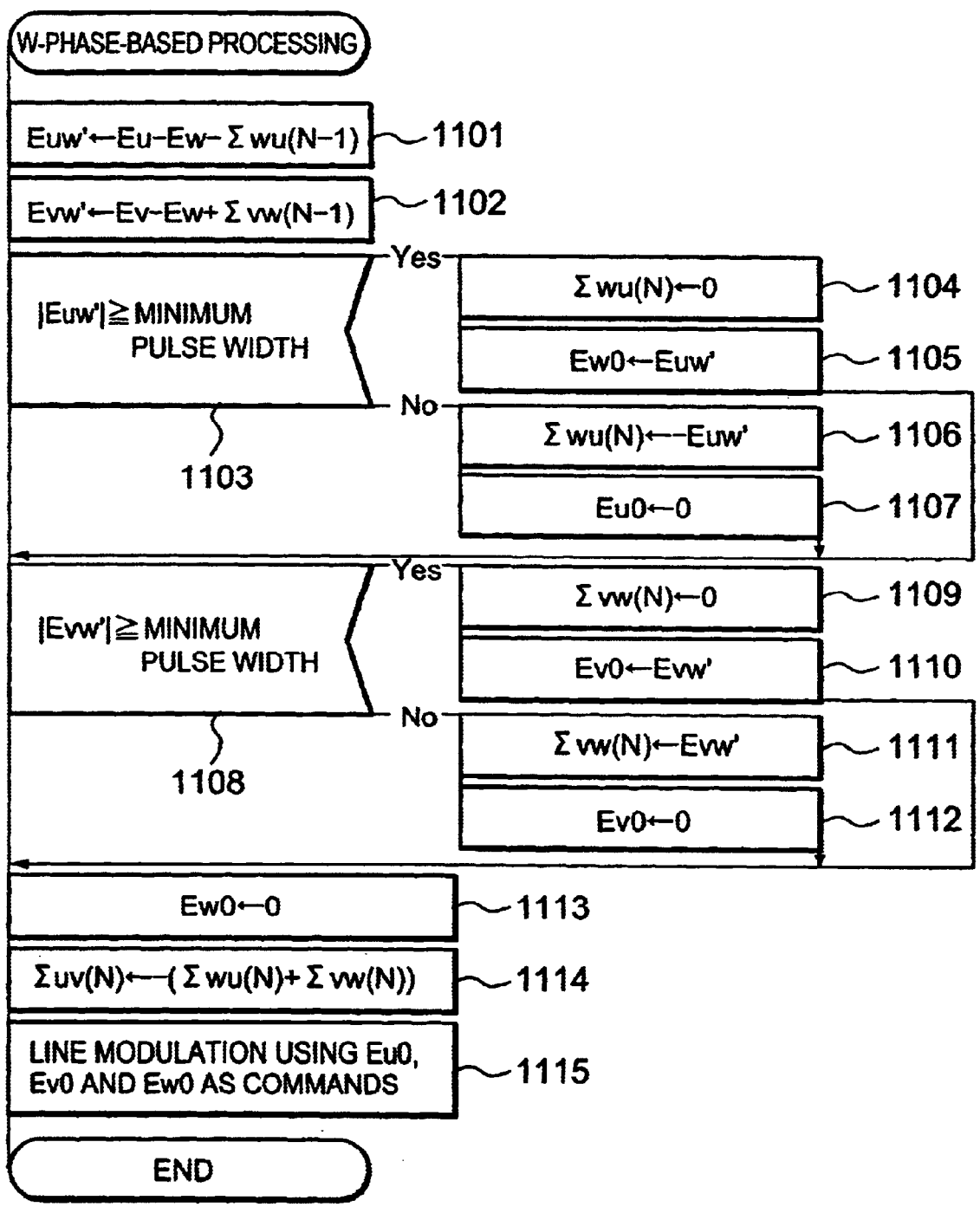
FIG. 5 is a flowchart showing W-phase-based processing as a part of the operation of the voltage command correction unit.

FIG. 5 is a flowchart showing the W-phase-based processing. In the W-phase-based processing, U, V and W in the U-phase-based processing are interchanged with W, U and V, respectively. In detail, the voltage command Ew is used instead of the voltage command Eu in the U-phase-based processing; the voltage command Eu instead of the voltage command Ev in the U-phase-based processing; the voltage command Ev instead of the voltage command Ew in the U-phase-based processing; the integrated W-U line voltage error Σwu(N−1) calculated in the previous processing instead of the integrated U-V line voltage error Σuv(N−1) calculated in the previous processing and used in the U-phase-based processing; the integrated V-W line voltage error Σvw(N−1) calculated in the previous processing instead of the integrated W-U line voltage error Σwu(N−1) calculated in the previous processing and used in the U-phase-based processing; the U-W line voltage command Euw' instead of the V-U line voltage command Evu' in the U-phase processing; the V-W line voltage command Evw' instead of the W-U line voltage command Ewu' in the U-phase-based processing; the integrated W-U line voltage error Σwu(N) instead of the integrated U-V line voltage error Σuv(N) in the U-phase-based processing; the integrated V-W line voltage error Σvw(N) instead of the integrated W-U line voltage error Σwu(N) in the U-phase-based processing; the integrated U-V line voltage error Σuv(N) instead of the integrated V-W line voltage error Σvw(N) in the U-phase-based processing; the after-correction voltage command Eu0 instead of the after-correction voltage command Ev0 in the U-phase-based processing; the after-correction voltage command Ev0 instead of the after-correction voltage command Ew0 in the U-phase-based processing; and the after-correction voltage command Ew0 instead of the after-correction voltage command Eu0 in the U-phase-based processing.

Figure 6:
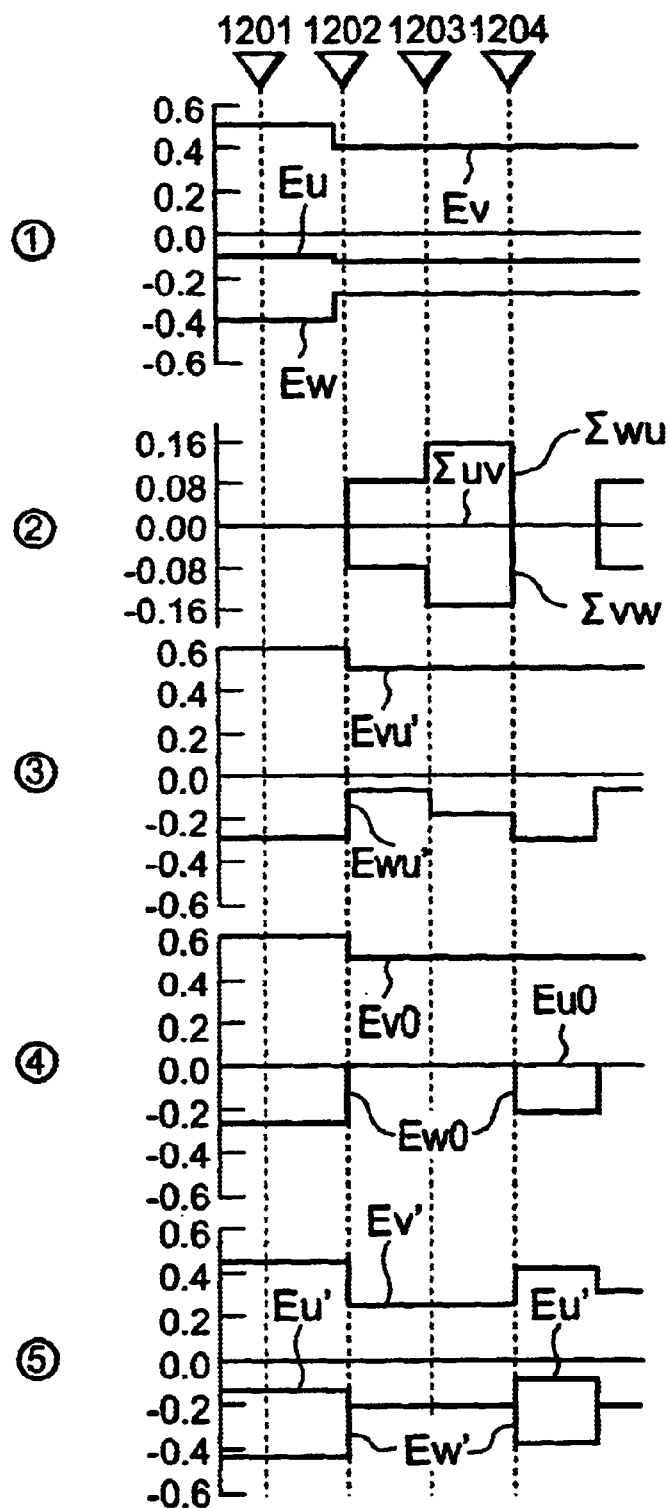
FIG. 6 is a waveform chart for explaining detailed operation of the voltage command correction unit.

Next, a detailed example of operation of the voltage command correction unit 9 will be described. FIG. 6 shows respective values of the variables in the voltage command correction unit 9, with the horizontal axis indicating time. Here, it is assumed that waveforms of the voltage commands Eu, Ev and Ew outputted by the motor control unit 8 are as shown in ①, and the minimum pulse width is 0.2.

Then, at the time T1201, among the processing shown in FIG. 2, the processing 801, the processing 807 and the processing 808 are performed in this order. Details of the processing 808, which is the U-phase-based processing, are as shown in FIG. 3. Here, the U-phase-based processing is performed since the voltage command Eu has the median value among the voltage commands Eu, Ev and Ew (the second highest value among the three voltage commands Eu, Ev and Ew). The absolute value of the line voltage between phases except for the middle phase, i.e., the V-W line voltage is larger than or equal to the absolute value of the V-U line voltage and the W-U line voltage, which are the line voltages based on the U phase. Accordingly, when the V-U and W-U pulse widths are made zero or not less than the minimum pulse width, then also the V-W line voltage is zero or not less than the minimum pulse width.

As a result, since Evu>0.2 and Ewu>0.2, all the integrated U-V line voltage error Σuv(N), the integrated W-U line voltage error Σwu(N) and the integrated V-W line voltage error Σvw(N) are zero as shown in ②. This is since all differences between the below-described after-correction line voltages and the corresponding input line voltages are zero. Further, each of the waveforms of the line voltage commands Evu' and Ewu' each including the integrated error of the line voltage is larger than or equal to the minimum pulse width 0.2, as shown in ③.

Accordingly, correction is not required, and the waveforms of the after-correction voltage commands Eu0, Ev0 and Ew0 are respectively 0, Evu' and Ewu', as shown in ④, and the line voltage commands are same as the line voltages of the after-correction voltage commands. Further, by the line modulation, the same value is added to each phase, and accordingly, each line voltage does not change. As a result, waveforms of the outputs Eu', Ev' and Ew' of the voltage command correction unit 9 are such ones as shown in ⑤ that the line voltage commands Eu, Ev and Ew are same as the line voltage Eu', Ev' and Ew' of the outputs of the voltage command correction unit 9.

At the time T1202 and the time T1203, the same processing is performed. Accordingly, the processing performed at the time T1203 is described here as the representative. In the processing shown in FIG. 2, the voltage command Eu has the median value, and accordingly, the processing same as the time T1201 is performed. Thus, the U-phase-based processing, i.e., the processing shown in FIG. 3 is performed.

In the U-phase-based processing, among the processing shown in FIG. 3, the processing 901, the processing 902, the processing 903, the processing 904, the processing 905, the processing 908, the processing 911, the processing 912, the processing 913, the processing 914 and the processing 915 are performed in this order. The processing from 901 to 905 is the same processing as the time T1201, and the description is omitted.

At the time T1203, correction is performed, since, by the comparison of the processing 908, it is judged that the absolute value of the line voltage command Ewu' calculated in the processing 902 is smaller than the minimum pulse width 0.2. In the processing 912 and the processing 913, the after-correction voltage command Ew0 and the after-correction voltage command Eu0 are set to zero. By this, an error is generated between the W-U line voltage before the correction and the W-U line voltage after the correction.

Accordingly, in the processing 911, the line voltage command Ewu' corresponding to this error is stored to the integrated W-U line voltage error Σwu(N). Further, since the sum total of the U-V line voltage, the V-W line voltage and the W-U line voltage is zero both before and after the correction, the integrated errors of the line voltages should be zero in the sum total. Accordingly, in the processing 914, the integrated V-W line voltage error Σvw(N) is updated such that the sum total becomes zero.

In the processing 915, the line voltages do not change, as described above, and, as a result, the W-U line voltage of the voltage command correction unit 9 becomes zero, and the respective integrated line voltage errors are stored to the integrated W-U line voltage error Σwu(N) and the integrated V-W line voltage error Σvw(N).

Next, processing performed at the time T1204 will be described. In the processing shown in FIG. 2, the voltage command Eu has the median value, the same processing as the time T1201 is performed. Thus, the U-phase-based processing, i.e., the processing shown in FIG. 3 is performed. In the U-phase-based processing, among the processing shown in FIG. 3, the processing 901, the processing 902, the processing 903, the processing 904, the processing 905, the processing 908, the processing 909, the processing 910, the processing 913, the processing 914, and the processing 915 are performed in this order. Here, only the processing different from the time T1201 will be described. At the time T1202 and the time T1203, the voltage to be outputted as the W-U line voltage is corrected to be zero, and the corrected voltage is integrated to the integrated W-U line voltage error Σwu(N−1). The sum of this integrated value and a difference between the voltage command Ew and the voltage command Eu becomes, for the first time, larger than or equal to the minimum pulse width 0.2. Namely, the line voltage command Ewu' calculated in the processing 902 becomes larger than or equal to the minimum pulse width 0.2, and in the processing 908, the processing 909 and the processing 910 are selected.

In the processing 910, the line voltage command Ewu', i.e., the voltage obtained by adding the voltage command to the integrated error that has been generated by correction, is put into the after-correction voltage command Ew0. Further, in the processing 913, the after-correction voltage command Eu0 is set to zero. By this, the integrated error becomes zero. Accordingly, in the processing 909, the integrated W-U line voltage error Σwu(N) is set to zero. Further, by the processing 904, the integrated U-V line voltage error Σuv(N) is zero, and accordingly, the calculation result in the processing 914 becomes zero, also. In the processing 915, the line voltages do not change, as described above, and as a result, the W-U line voltage of the voltage command correction unit 9 becomes the value that contains the up-to-date integrated error. As a result, all the integrated line voltage errors become zero, at this point.

Figure 7:
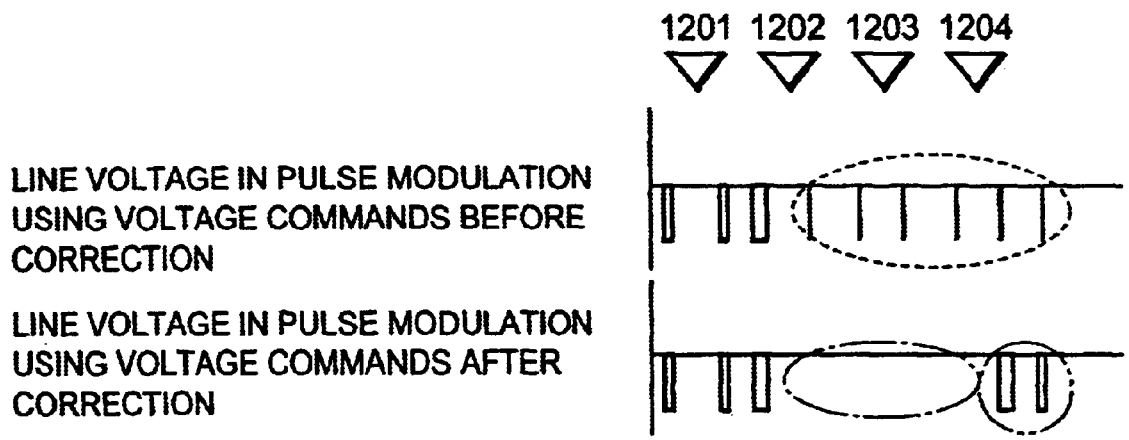
FIG. 7 is a waveform chart for comparing line voltages before and after correction.

FIG. 7 shows a waveform of a line voltage in the case of pulse width modulation with the voltage commands before correction, and a waveform of a line voltage in the case of pulse width modulation with the voltage commands after correction, with the horizontal axis indicating time. The upper side of FIG. 7 shows the waveform of the U-W line voltage in the case of pulse width modulation based on the outputs of the motor control unit 8, and the lower side of FIG. 7 shows the waveform of the line voltage in the case of pulse width modulation based on the outputs of the voltage correction unit 9. Namely, it is the U-V line voltage obtained by applying the first embodiment, and the pulses enclosed by the dotted line are pulses narrower than the minimum pulse width.

In the waveform on the lower side of FIG. 7, errors are only integrated, and a pulse is not outputted, in the part enclosed by the one-dot chain line, while in the part enclosed by the two-dot chain line, pulses are outputted in lump sums. Accordingly, an average of the pulse width is same in both sides, while, in the case of the waveform on the lower side of FIG. 7, the minimum pulse width can be ensured in the outputted pulses. Further, the waveform on the lower side of FIG. 7 does not include a pulse narrower than the minimum pulse width.

Further, in the present embodiment, when a line voltage command is less than the minimum pulse width, the after-correction voltage command is set to zero. However, when the after-correction voltage command is set smaller than the line voltage command and larger than zero, the integrated line voltage error can be correspondingly made smaller, and the line voltage error at the time of correction can be suppressed.

Further, it is possible that the integrated line voltage error is always treated as zero, and when a line voltage command is less than the minimum pulse width, the after-correction voltage command is set to the minimum pulse width. By this, although an error is generated in the average of the line voltage, amount of calculation can be reduced. Further, the minimum pulse width can be always ensured.

Next, a second embodiment according to the present invention will be described. The present embodiment differs from FIG. 18 in the configuration of the PWM control unit 6. Accordingly, only the configuration of the PWM control unit 6 will be described here.

Figure 8:
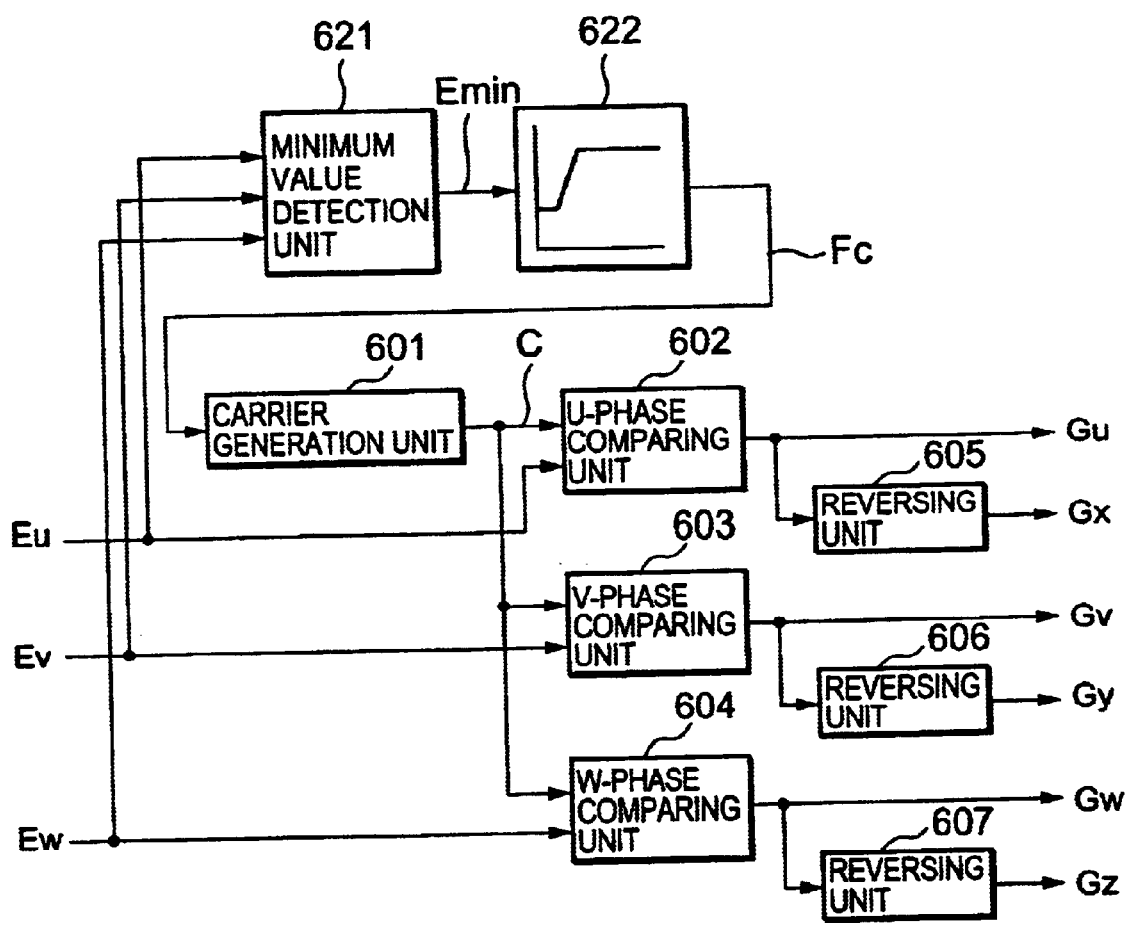
FIG. 8 is a schematic diagram showing a PWM control unit according to a second embodiment of the present invention.

FIG. 8 shows a configuration of the PWM control unit 6 according to the present embodiment. In comparison with FIG. 18, like numerals show like components, and their description is omitted. In FIG. 8, a minimum value detection unit 621 outputs the minimum value Emin based on the AC voltage commands Eu, Ev and Ew. In detail, the minimum value detection unit 621 obtains a difference between Eu and Ev, a difference between Ev and Ew, and a difference between Ew and Eu, and outputs the minimum absolute value (the minimum value Emin) among the absolute values of those three differences.

A table reference unit 622 outputs a carrier frequency command Fc to be inputted to the carrier generation unit 601, based on the minimum value Emin, and referring to a table given in advance. The table stores correspondence information on the correspondence between the minimum value Emin and the carrier frequency command Fc, such that the smaller the minimum value Emin is, the smaller the carrier frequency command Fc is, and the larger the minimum value Emin is, the larger the carrier frequency command Fc is. Namely, when at least one of differences between a plurality of signals, the AC voltage commands Eu, Ev and Ew, is small, i.e., lies in the neighborhood of zero, the carrier frequency command Fc is made smaller to make the frequency of the carrier lower.

Figure 9:
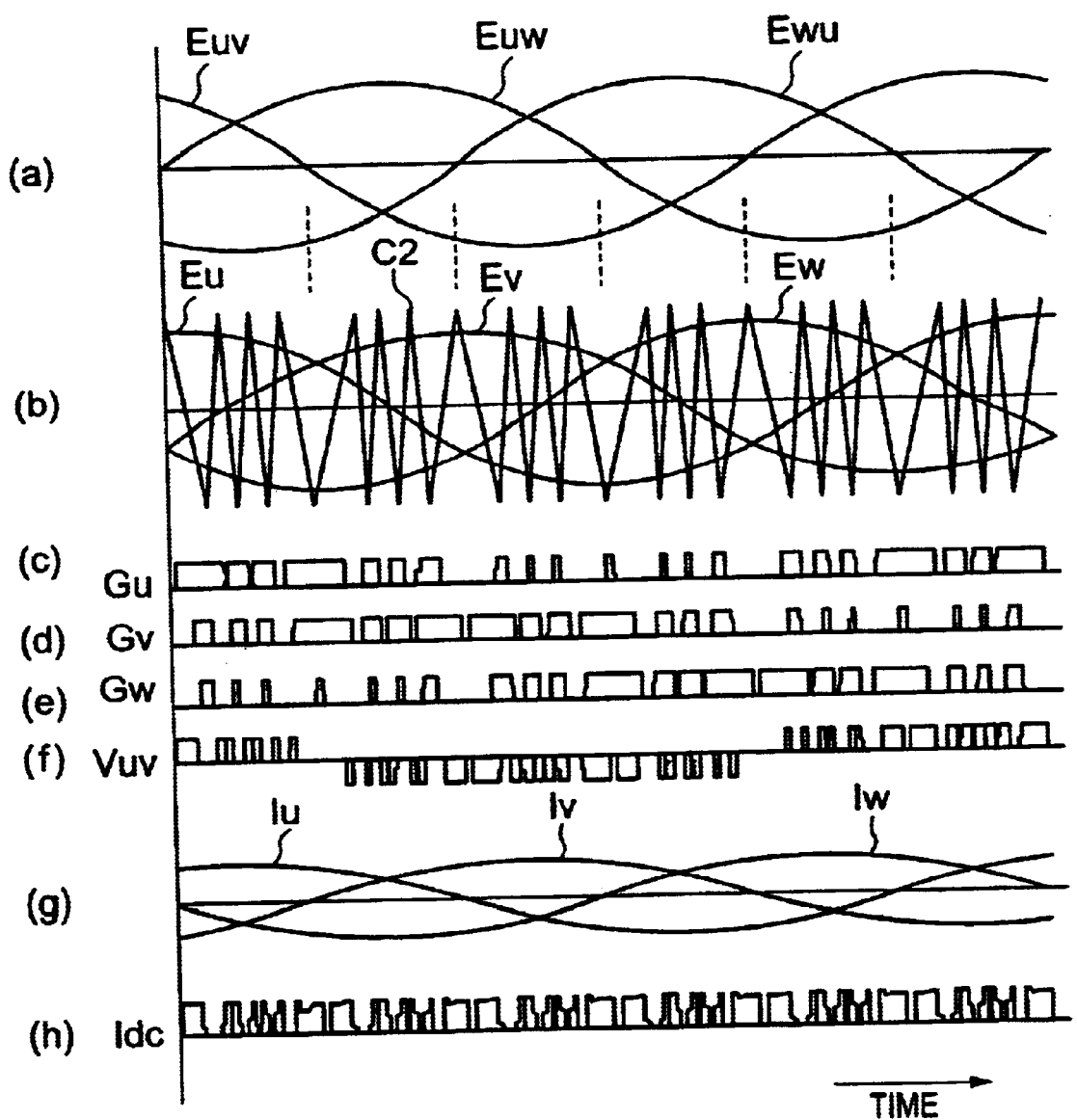
FIG. 9 is a waveform chart for explaining operation of a power converter according to the second embodiment of the present invention.

Next, operation of the power converter according to the second embodiment of the present invention will be described. FIG. 9 shows waveforms expressing the operation of the power converter according to the second embodiment of the present invention. In FIG. 9, (a) shows waveforms of the output line voltage commands Euv, Evw and Ewu of the power converter 10, which are obtained from differences between the voltage commands Eu, Ev and Ew. FIG. 9(b) shows waveforms of the AC voltage commands Eu, Ev and Ew and a waveform of the carrier C2 for pulse width modulation of the AC voltage commands. FIG. 9(c) shows a waveform of the gate signal Gu, (d) shows a waveform of the gate signal Gv, and (e) shows a waveform of the gate signal Gw. FIG. 9(f) shows a waveform of the line voltage Vuv between the U-phase output and the V-phase output, (g) shows waveforms of the currents Iu, Iv and Iw, and (h) shows a waveform of the DC current Idc.

Figure 20:
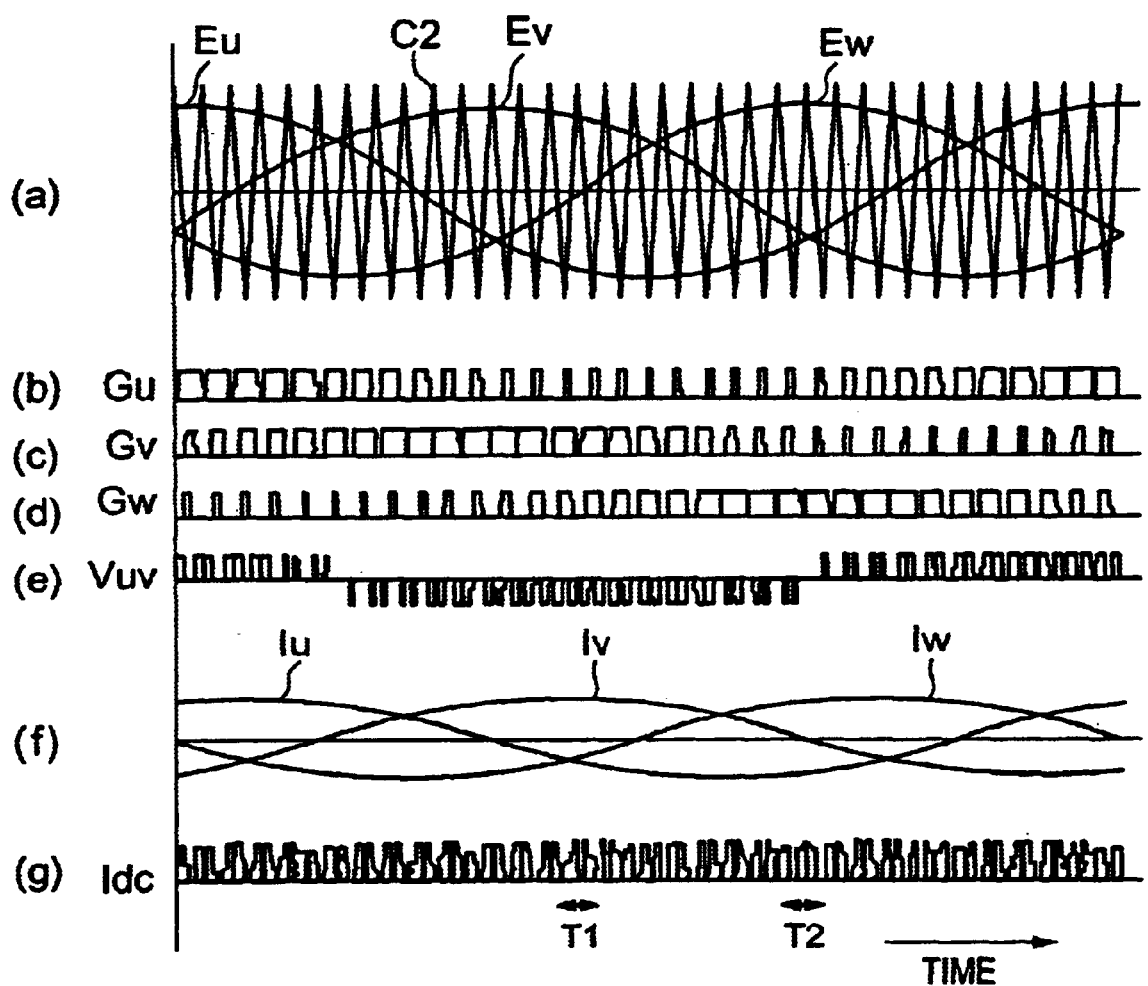
FIG. 20 is a waveform chart for explaining operation of the power converter of FIG. 18.
Figure 21:
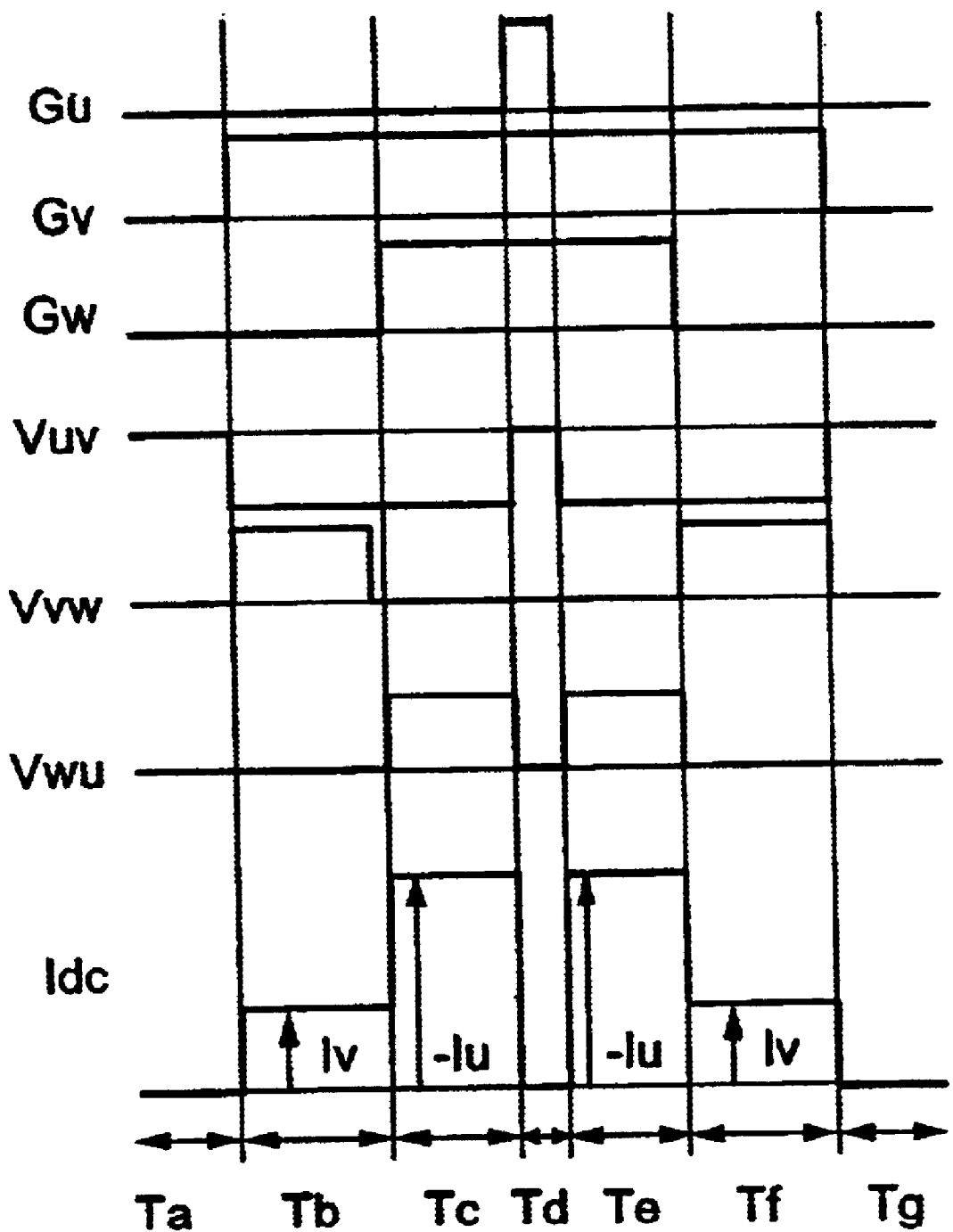
FIG. 21 is a waveform chart for explaining detailed operation of the power converter of FIG. 18.
Figure 22:
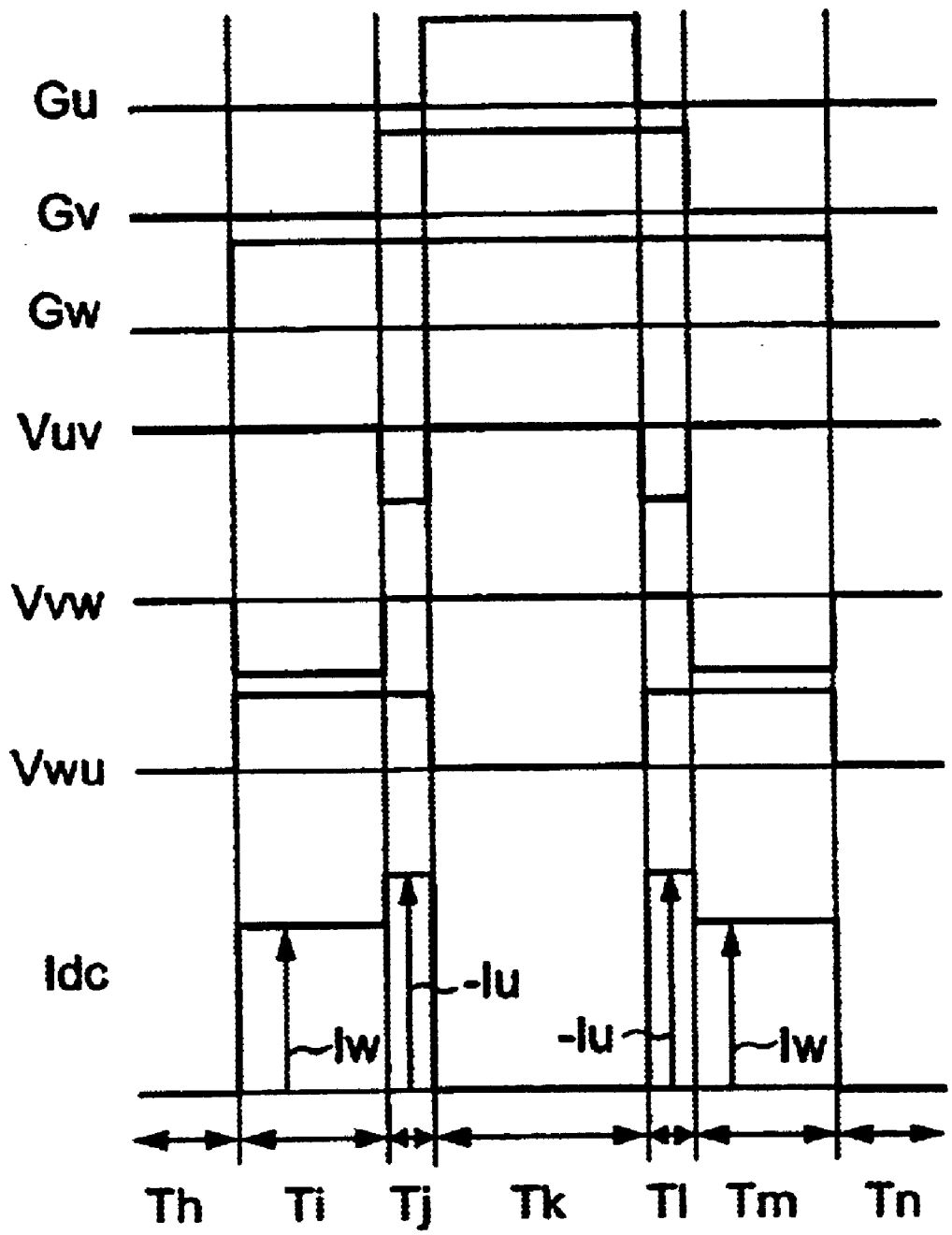
FIG. 22 is a waveform chart for explaining detailed operation of the power converter of FIG. 18.
Figure 23:
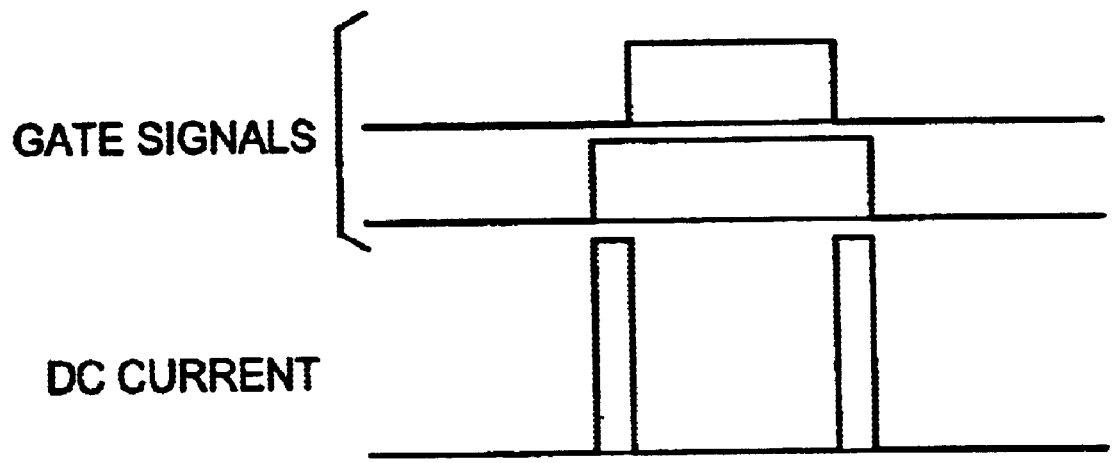
FIG. 23 is a waveform chart for explaining problems of the power converter of FIG. 18.
Figure 24:
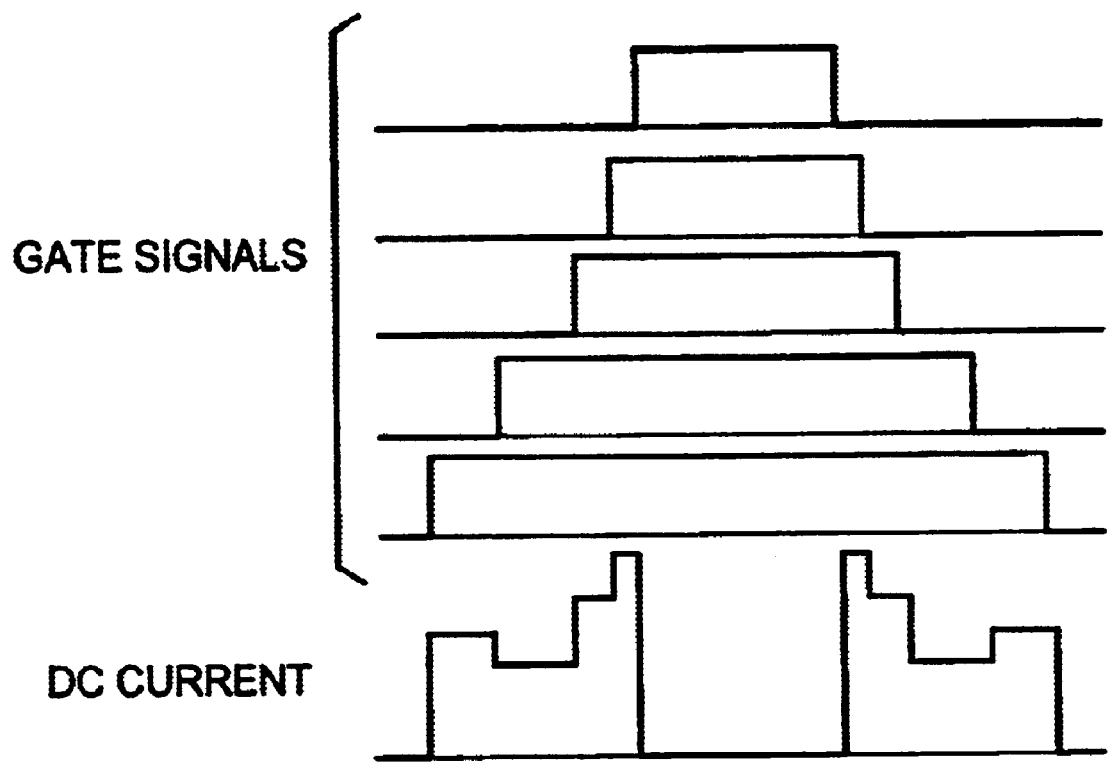
FIG. 24 is a waveform chart for explaining problems of the power converter of FIG. 18.

FIG. 9 differs from FIG. 20 in that the frequency of the carrier 2 becomes lower in the neighborhoods of points (shown by the dotted lines) where the line voltage command Euv, Evw or Ewu is zero. By this, the pulse frequencies of the gate signals Gu, Gv and Gw become lower, and also the pulse frequency of the line voltage Vuv becomes lower. As a result, at parts where the pulse duty of the line voltage Vuv becomes smaller, the pulse is enlarged, and periods in which the DC current Idc can be sampled are widened. As a result, the current can be easily detected.

Although, in the above, the frequency of the carrier is lowered in the neighborhoods of points where the line voltage command becomes zero, it is not necessary. For example, also in the case of the waveform obtained by low-pass filtering the line voltage Vuv, an area in which its value lies in the neighborhood of zero coincide with an area in which the line voltage command lies in the neighborhood of zero. Accordingly, the carrier frequency may be lowered in areas where the waveform obtained by low-pass filtering the line voltage Vuv lies in the neighborhoods of zero. In the following, this case is described as a third embodiment of the present invention.

Figure 10:
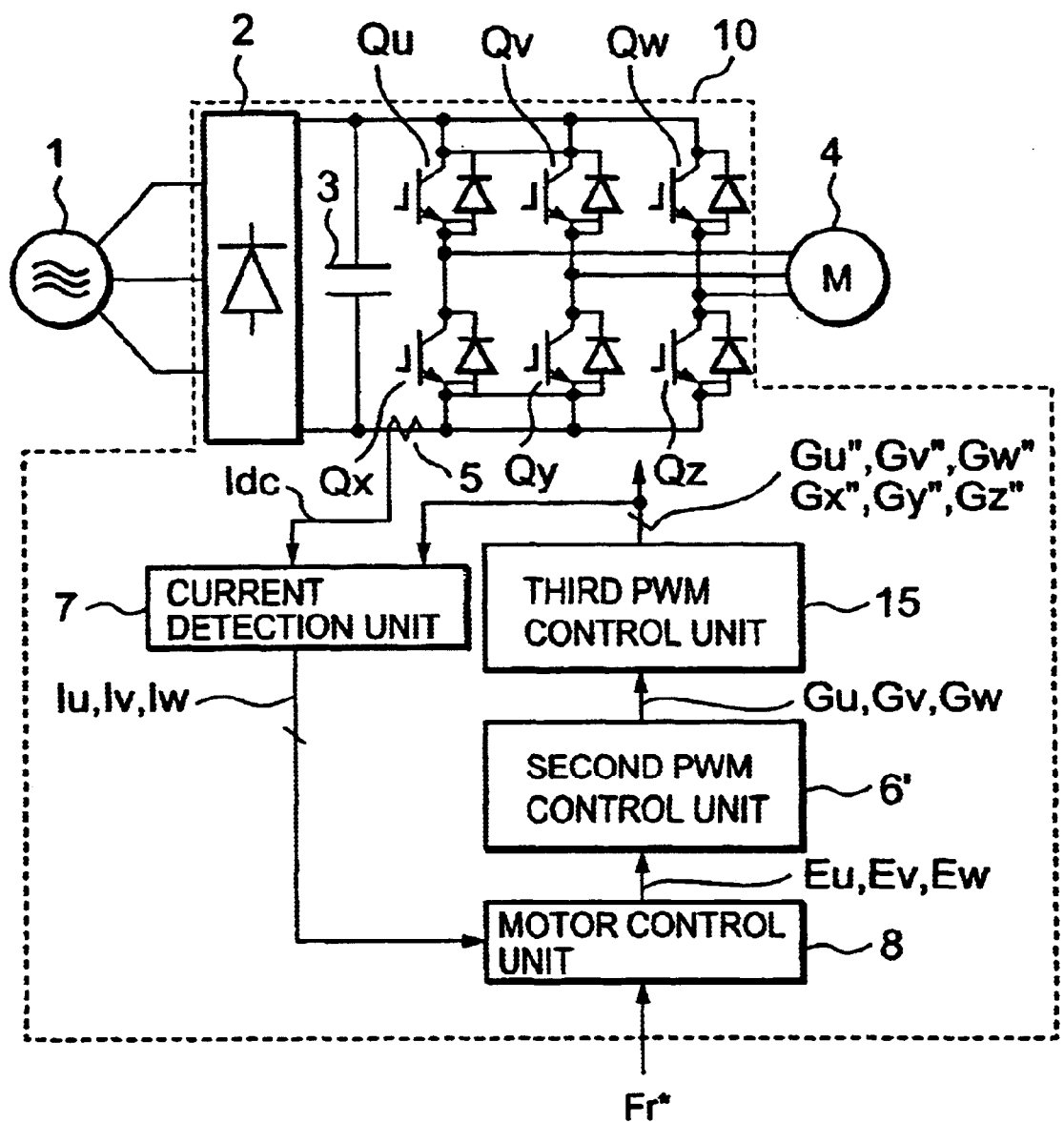
FIG. 10 is a schematic diagram showing a power converter according to a third embodiment of the present invention.
Figure 19:
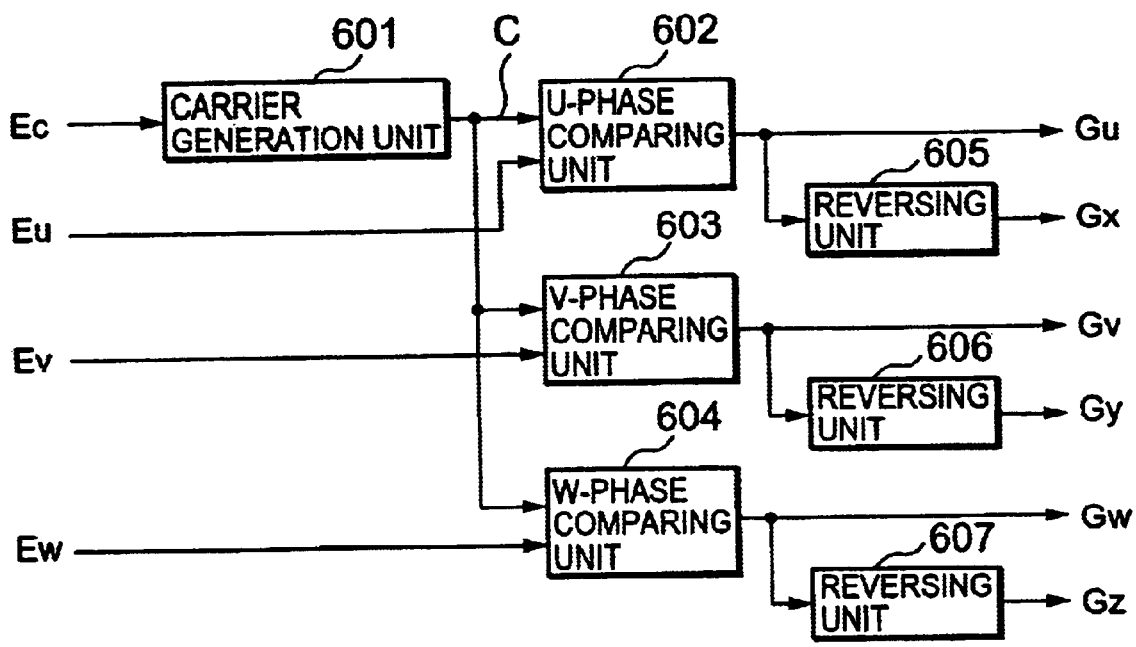
FIG. 19 is a schematic diagram showing the PWM control unit shown in FIG. 18.

FIG. 10 shows a configuration of a power converter according to the third embodiment of the present invention. Here, in comparison with FIGS. 18 and 19, like numerals show like components, and their description is omitted. Namely, here, only parts different from the configurations of FIGS. 18 and 19 will be described. In FIG. 10, a second PWM control unit 6' and a third PWM control unit 15 are the parts different from the configurations of FIGS. 18 and 19.

Figure 11:
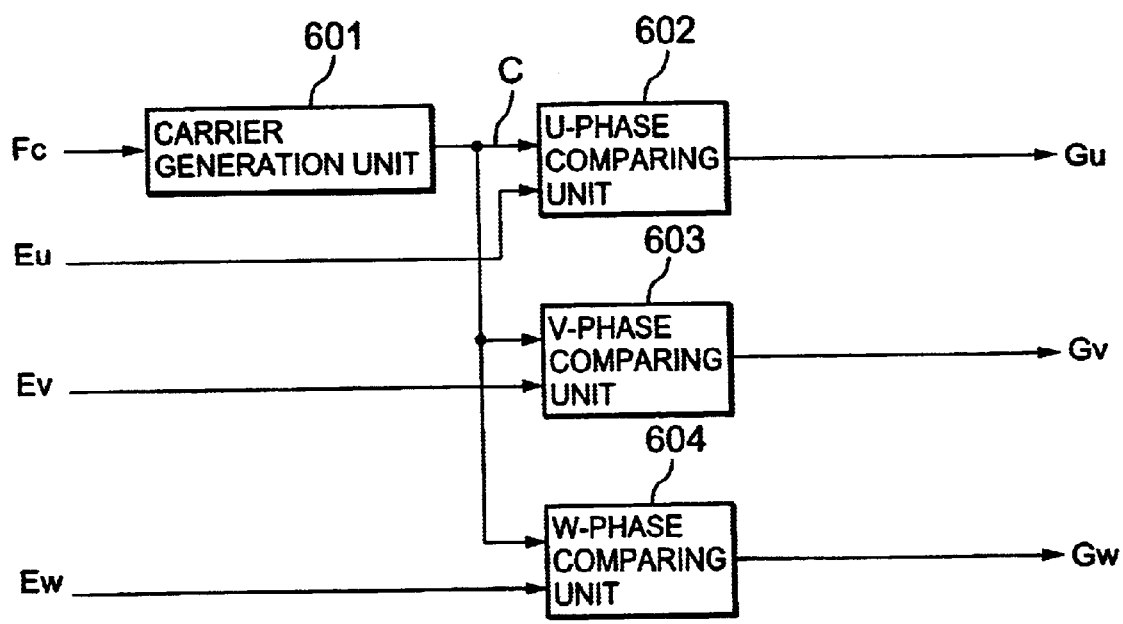
FIG. 11 is a schematic diagram showing a second PWM control unit according to the third embodiment of the present invention.

FIG. 11 shows a configuration of the second PWM control unit 6'. FIG. 11 differs from FIG. 19 in that the reversing units 605, 606 and 607 do not exist. As a result, outputs of the second PWM control unit 6' do not include the gate signals Gx, Gy and Gz.

Figure 12:
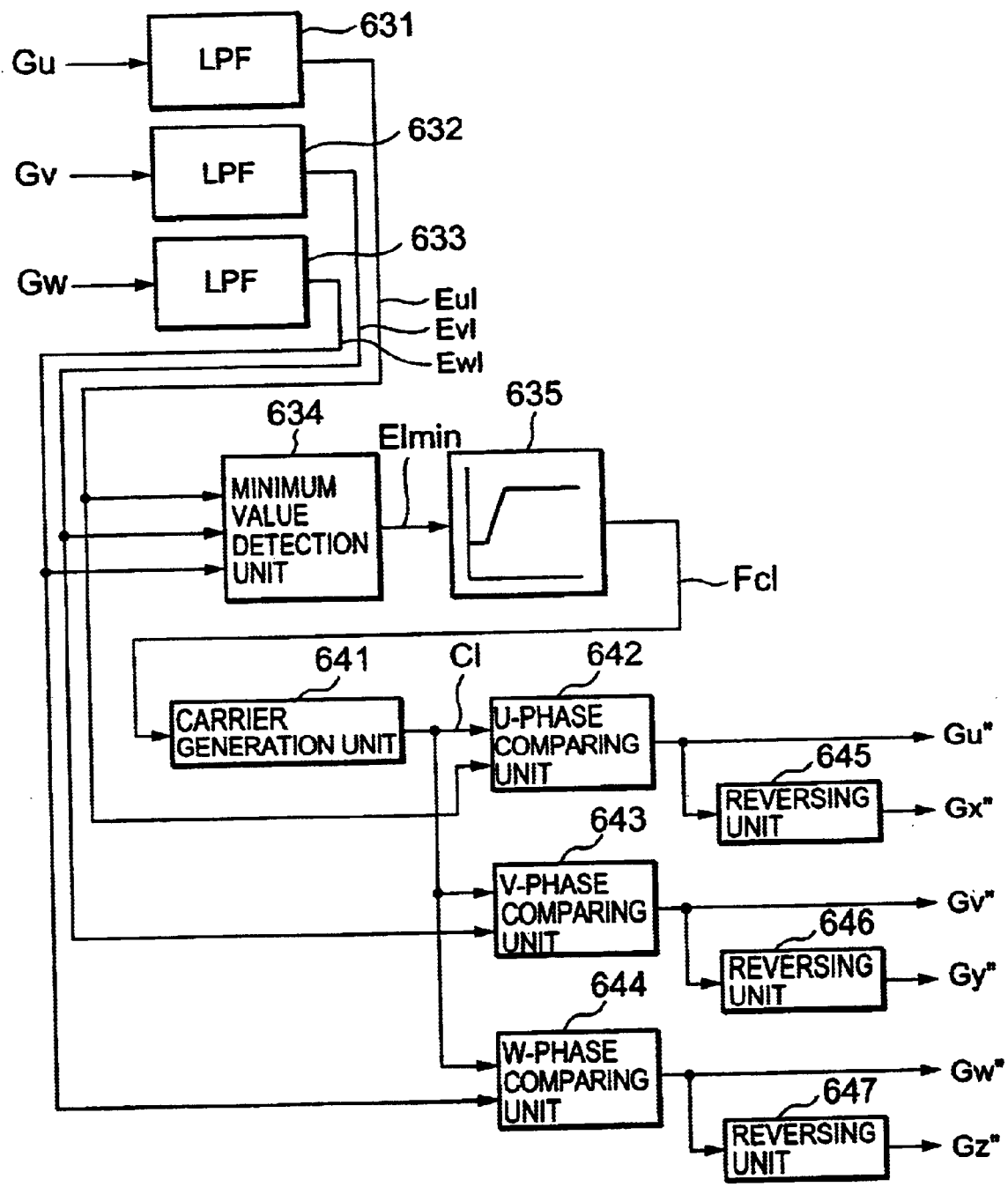
FIG. 12 is a schematic diagram showing a third PWM control unit according to the third embodiment of the present invention.

FIG. 12 shows a configuration of the third PWM control unit 15. As the inputs, the third PWM control unit 15 receives the gate signals Gu, Gv and Gw, i.e., three pulse signals outputted by the PWM control unit 6', and outputs third gate signals Gu", Gv", Gw", Gx", Gy", and Gz". In FIG. 12, the reference numerals 631, 632 and 633 refer to low-pass filters (LPF), 634 to a minimum value detection unit, 635 to a table reference unit, 641 to a carrier generation unit, 642 to a U-phase comparing unit, 643 to a V-phase comparing unit, 644 to a W-phase comparing unit, and 645, 646 and 647 to reversing units.

The low-pass filter 631 removes a high-frequency component, and outputs only a low-frequency component as a voltage command Eul. Since the voltage command Eul is the low-frequency component of the pulse signal obtained by the pulse width modulation, the waveform of the voltage command Eul becomes similar to the waveform of the AC voltage command Eu (see FIG. 10) as the modulated wave. Similarly, the low-pass filters 632 and 633 receives the gate signals Gv and Gw and output voltage commands Evl and Ewl, respectively.

The minimum value detection unit 634 outputs the minimum value Elmin based on the voltage commands Eul, Evl and Ewl. The minimum value detection unit 634 obtains a difference between Eul and Evl, a difference between Evl and Ewl, and a difference Ewl and Eul, and outputs the minimum absolute value among the absolute values of the three differences, as the minimum value Elmin.

Referring to a table given in advance, the table reference unit 635 outputs a carrier frequency command Fcl associated with the minimum value Elmin inputted from the minimum value detection unit 634. This carrier frequency command Fcl becomes an input signal to the carrier generation unit 641. Here, the table, to which the table reference unit 635 refers, stores correspondence information on the correspondence between the minimum value Elmin and the carrier frequency command Fcl, such that the smaller the minimum value Elmin from the minimum value detection unit 634 is, the smaller the carrier frequency command Fcl to be inputted to the carrier generation unit 641 is, and the larger the minimum value Elmin is, the larger the carrier frequency command Fcl to be inputted to the carrier generation unit 641 is. By this, when at least one of differences between the voltage commands Eul, Evl and Ewl as the low-frequency components of the gate signals Gul, Gvl and Gwl as pulse signals is small (namely, lies in the neighborhood of zero), the carrier frequency command Fcl becomes small and the carrier frequency becomes low.

Based on the carrier frequency command Fcl, the carrier generation unit 641 outputs a carrier Cl, i.e., a triangular wave of the frequency Fcl. The U-phase comparing unit 642, which outputs the gate signal Gu", compares the voltage command Eul with the carrier Cl. As a result, when the voltage command Eul is larger or equal, the U-phase comparing unit 642 outputs the H level, and when the voltage command Eul is smaller, it outputs the L level. Further, the reversing unit 645, which outputs the gate signal Gx", outputs the H level when the gate signal Gu" is L level, and outputs the L level when the gate signal Gu" is H level.

Similarly, the V-phase comparing unit 643, which outputs the gate signal Gv", compares the V-phase AC voltage command Evl with the carrier Cl. As a result, when the V-phase AC voltage command Evl is larger or equal, the V-phase comparing unit 643 outputs the H level, and when the V-phase AC voltage command Evl is smaller, it outputs the L level. Further, the reversing unit 646, which outputs the gate signal Gy", outputs the H level when the gate signal Gv" is L level, and outputs the L level when the gate signal Gv" is H level.

Further, the W-phase comparing unit 644, which outputs the gate signal Gw", compares the W-phase AC voltage command Ewl with the carrier Cl. As a result, when the W-phase AC voltage command Ewl is larger or equal, the W-phase comparing unit 644 outputs the H level, and when the W-phase AC voltage command Ewl is lower, it outputs the L level. Further, the reversing unit 647, which outputs the gate signal Gz", outputs the H level when the gate signal Gw" is L level, and outputs the L level when the gate signal Gw" is H level. By this, when the carrier frequency is low, the pulse intervals can be lengthened.

Each signal of the power converter according to the third embodiment of the present invention can be obtained by replacing the carrier C2 and gate signals Gu, Gv and Gw of the waveforms shown in FIG. 9 with the carrier Cl and the gate signals Gu", Gv" and Gw". As described above, the waveforms of the voltage commands Eul, Evl and Ewl are similar to the waveforms of the AC voltage commands Eu, Ev and Ew, respectively. Accordingly, the similar effect to the above-described second embodiment can be obtained.

Hereinabove, a three-phase power converter has been taken as an example to which the present invention is applied. However, the present invention can be applied to a pulse width modulation system in a microcomputer. In the following, such a pulse width modulation system is described as a fourth embodiment.

Figure 13:
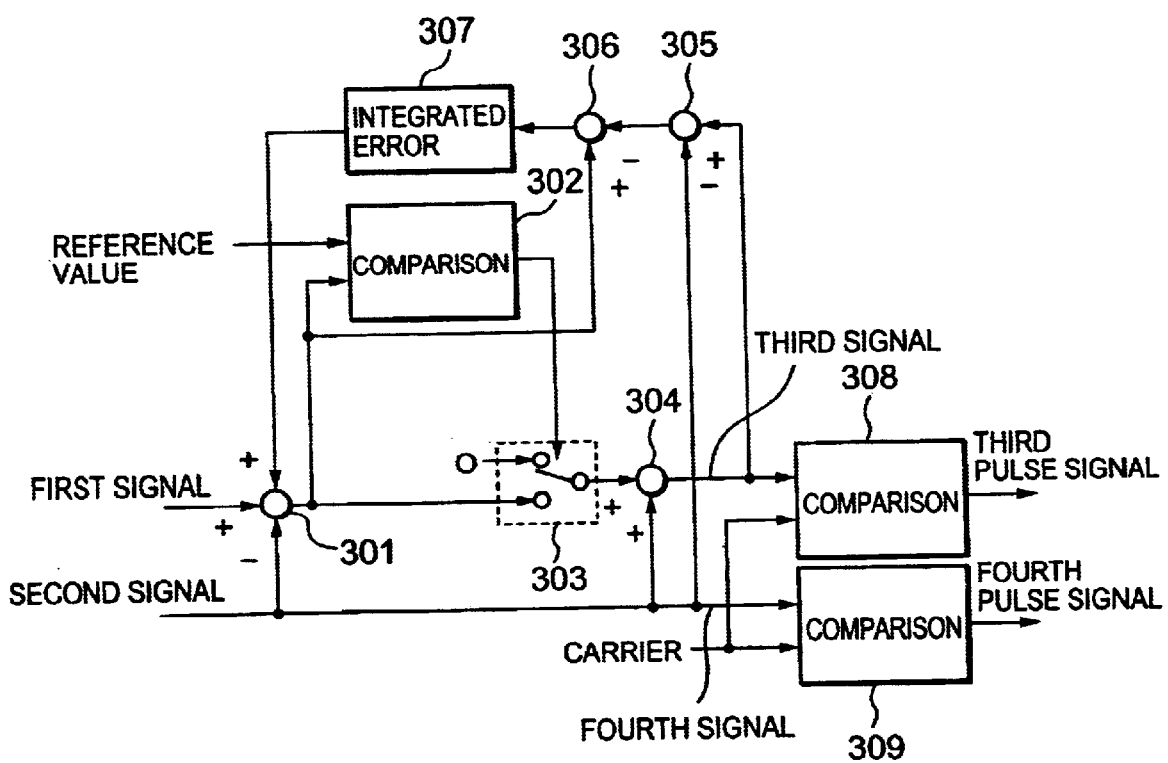
FIG. 13 is a schematic diagram showing a pulse modulator according to a fourth embodiment of the present invention.

FIG. 13 shows a configuration of a pulse width modulator according to the fourth embodiment of the present invention. This pulse width modulator performs pulse width modulation on first and second signals and outputs third and fourth pulse signals.

In FIG. 13, the reference numeral 301 refers to a first adding circuit 301 that adds a difference between the first and second signals and an integrated error to obtain a signal difference; 302 to a first comparing circuit the signal difference outputted from the first adding circuit 301 with a reference value of a predetermined value; 303 to a switching circuit that outputs zero when a comparison result of the first comparing circuit 302 is "the output of the adding circuit 301 is smaller than the reference value", and outputs the output signal of the first adding circuit 301 when the comparison result of the first comparing circuit 302 is "the output of the adding circuit 301 is larger than or equal to the reference value"; 304 to a second adding circuit that adds the output of the switching circuit 303 and the second signal; 305 to a first subtracting circuit that subtracts the second signal from the output of the second adding circuit 304; 306 to a second subtracting circuit that subtracts the output of the first subtracting circuit 305 from the first adding circuit 301; 307 to an integrated error storing unit that stores the output of the second subtracting circuit as an integrated error; 308 to a second comparing circuit that performs pulse width modulation by comparing the carrier with the output of the second adding circuit 304; and 309 to a third comparing circuit that performs pulse width modulation by comparing the carrier with the second signal.

The first adding circuit 301 is structured such that a difference between a plurality of signals (here, two signals) and an integrated error are added to obtain a signal difference. The first comparing circuit 302, the switching circuit 303 and the second adding circuit 304 correct the mentioned signal such that, when the mentioned signal difference is less than the predetermined value, the difference between the mentioned two signals becomes zero (or, becomes smaller than the mentioned signal difference), and when the mentioned signal difference is more than or equal to the predetermined value, the difference between the mentioned two signals becomes the mentioned signal difference. The subtracting circuits 305 and 306 and the integrated error storing unit 307 obtains the integrated error from the corrected difference between two signals and the above-mentioned signal difference.

Figure 14:
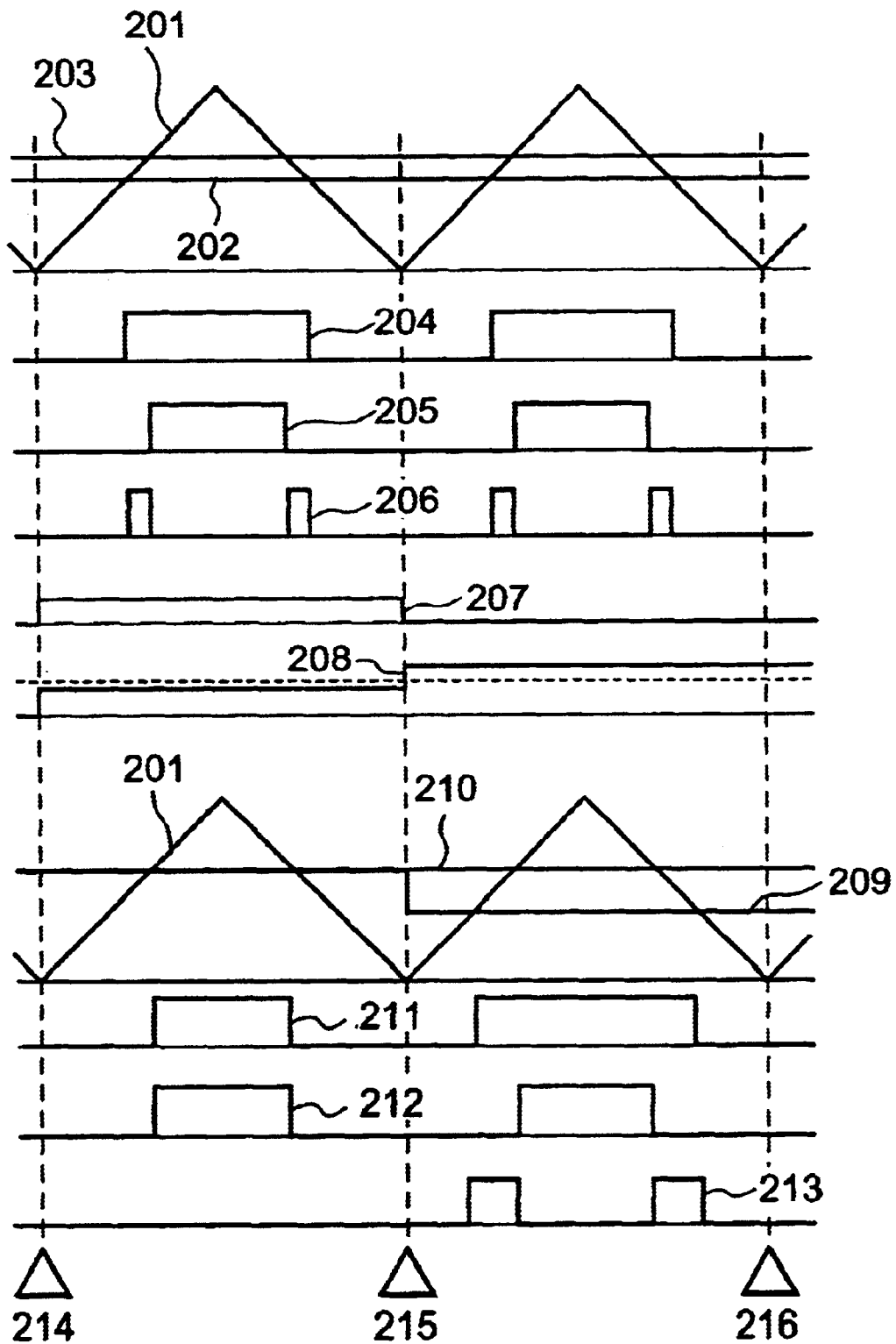
FIG. 14 is a waveform chart showing operation of a power converter according to the fourth embodiment of the present invention.

Next, operation of the pulse width modulator shown in FIG. 13 will be described referring to operating waveforms shown in FIG. 14. In FIG. 14, the reference numeral 201 refers to the carrier for performing the pulse width modulation; 202 to the first signal as one of the plurality of signals; 203 to the second signal as one of the plurality of signals; 204 to a first pulse signal that is obtained, for example, by performing the pulse width modulation on the first signal, according to the conventional system; 205 to a second pulse signal that is obtained by performing the pulse width modulation on the second signal, according to the conventional system; and 206 to a first pulse signal difference, i.e., a difference between the first pulse signal and the second pulse signal. Here, the waveforms 204, 205 and 206 are added for comparing the pulse width modulation according to the present embodiment and the conventional pulse width modulation, and those signals do not appear in the schematic diagram of FIG. 13.

Further, the reference numeral 207 refers to the integrated error as the output of the integrated error storing unit 307; 208 to the output of the first adding circuit 301, i.e., the signal difference obtained by adding the difference between the first and second signals and the integrated error; 209 to the output of the second adding circuit 304, i.e., the third signal that is obtained by correcting the first signal 202 in the present embodiment; 210 to the fourth signal that is obtained by correcting the second signal 203 in the present embodiment; 211 to the third pulse signal, which is the output of the second comparing circuit 308 and obtained by performing the pulse width modulation on the third signal 209; 212 to the fourth pulse signal, which is the output of the third comparing circuit 309 and obtained by performing the pulse width modulation on the fourth signal 210; 213 to a second pulse signal difference i.e., a difference between the third and fourth pulse signals; 214 to a first time showing a point for processing; 215 to a second time showing another point for processing; and 216 to a third time showing still another point for processing. Here, the waveform 213 is added for the sake of convenience, and does not exist in the configuration shown in FIG. 13.

By comparing the first signal 202 and the second signal 203 with the carrier 201, the first pulse signal 204 and the second pulse signal 205 are obtained, respectively. A difference between the first pulse signal 204 and the second pulse signal 205 becomes the first pulse signal difference 206. At that time, sometimes, the pulse width obtained in the first pulse signal difference 206 becomes narrower than the required pulse width. In the following, with respect to such a case, operation of the pulse modulator according to the present embodiment will be described.

At the first time 214, the integrated error 207 before processing is zero. When the integrated error 207 before processing is added to a difference between the first signal 202 and the second signal 203, the signal difference 208 is obtained. Next, the first signal 202 and the second signal 203 are corrected to obtain the third signal 209 and the fourth signal 210, respectively. In that case, as shown by the dotted line, the signal difference 208 is less than the predetermined value (the minimum pulse width), the switching circuit 303 outputs zero, and the second adding circuit 304 outputs the second signal 203 as the third signal 209.

Thus, the first signal 202 is corrected to become the third signal 209 such that the difference between the third signal 209 and the fourth signal 210 becomes zero. Here, the correction is performed on the basis of the second signal 203, and thus, the fourth signal 210 is same as the second signal 203. Further, by comparing the magnitudes of the third signal 209 and the fourth signal 210 with the carrier 201, the third pulse signal 211 and the fourth pulse signal 212 are obtained, respectively. The difference between the third pulse signal 211 and the fourth pulse signal 212 becomes the second pulse signal difference 213. Further, the integrated error 207 is updated to be the signal difference 208.

At the second time 215, the integrated error 207 before processing is the signal difference 208 at the first time 214. Similarly to the first time 214, the signal difference 208 is obtained. Next, the first signal 202 and the second signal 203 are corrected to obtain the third signal 209 and the fourth signal 210, respectively. In that case, the signal difference 208 becomes larger than or equal to the predetermined value shown by the dotted line, and accordingly, the switching circuit 303 outputs the output of the first adding circuit 301, and the second adding circuit 304 adds the second signal and the output of the first adding circuit 301 and outputs the sum as the third signal 209

Thus, the first signal 202 is corrected to become the third signal 209 such that the difference between the third signal 209 and the fourth signal 210 becomes the signal difference 208. Here, the correction is performed on the basis of the second signal 203, and thus, the fourth signal 210 is same as the second signal 203. Further, similarly to the first time 214, the third pulse signal 211, the fourth pulse signal, and the second pulse signal difference 213 are obtained. Further, the integrated error 207 is updated to be zero.

When the second pulse signal difference 213, which has been subjected to the correction according to the present embodiment, is compared with the first pulse signal difference 206 according to the conventional system, it is seen that the pulses to be outputted between the first time 214 and the second time 215 are deleted, and the deleted pulses are added to the pulses to be outputted between the second time 215 and the third time 216, and the resultant pulses are outputted. This widens the pulse width, ensuring the required pulse width.

Further, as clearly seen from FIG. 14, between the time 214 and the time 216, the time average of the second pulse signal difference 213 and the time average of the first pulse signal difference 206 are same.

In the present fourth embodiment, the case in which the number of the signals is two is taken as an example. When the number of the signals is three or more, those signals may be listed in the order of their largeness, and then, the above procedure may be applied to each adjacent pair of signals successively.

Figure 15:
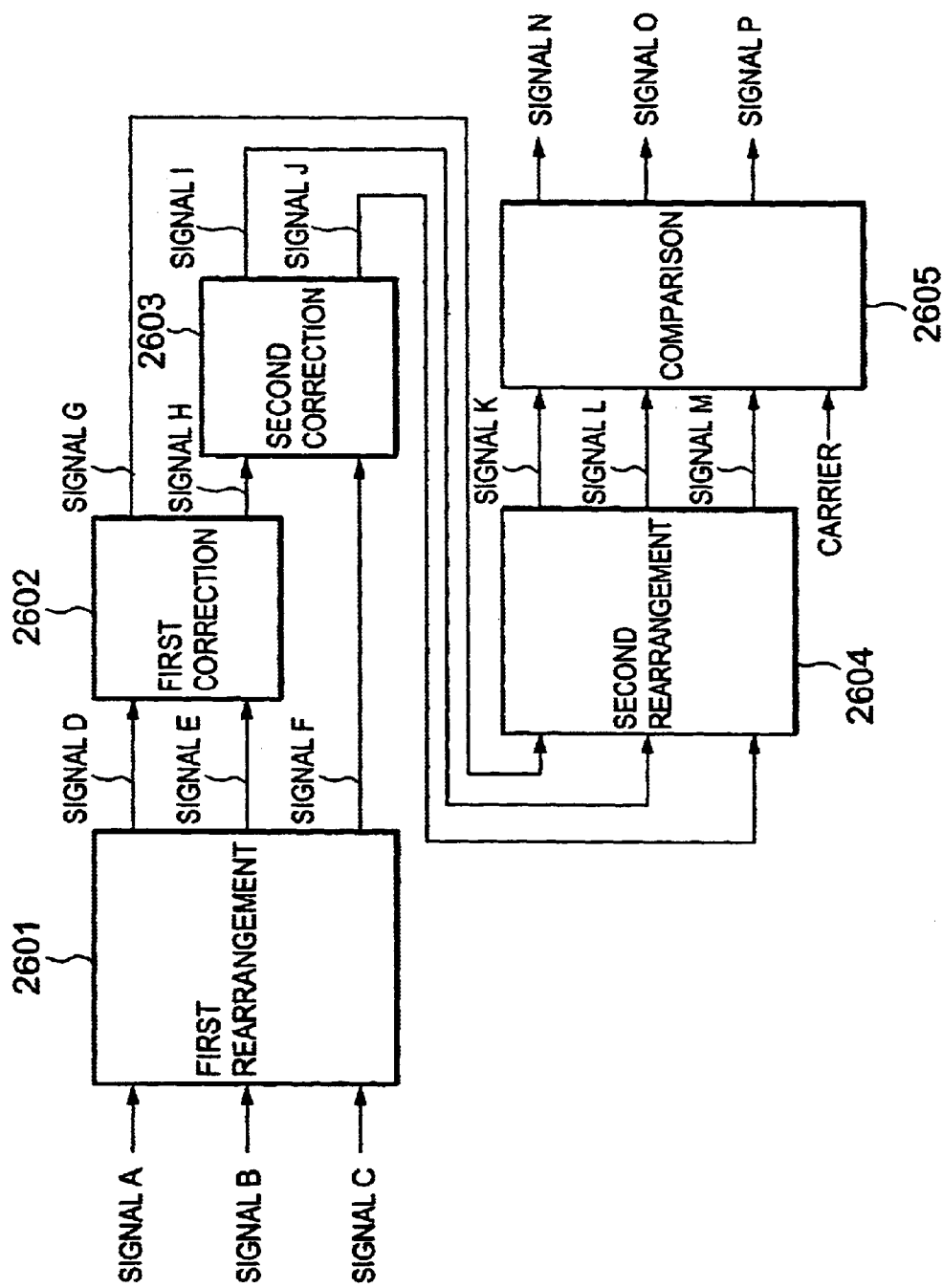
FIG. 15 is a schematic diagram showing a pulse modulator in the case of extending the fourth embodiment of the present invention to three signals.

FIG. 15 shows a configuration of the pulse width modulator in the case of three signals. In FIG. 15, the reference numeral 2601 refers to a first rearranging means 2601 that receives a plurality of inputted signals A, B and C as input, and rearranges the inputted signals into the ascending order of their largeness, to outputs the rearranged signals as signals D, E and F; a first correction means 2602 that receives input of the signals D and E, and outputs signals G and H; a second correction means 2603 that receives input of the signals H and F and outputs signals I and J; a second rearranging means 2604 that receives the signals G, I and J, and rearranges the inputted signals into the order reverse to the order according to the first rearranging means 2601, to output the rearranged signals as signals K, L and M; and a comparing means 2605 that performs pulse width modulation on the signals K, L and M by comparing those signals with the carrier, to output the modulated signals as signals N, O and P.

The first correction means 2602 is structured such that the carrier, the second comparing circuit 308 and the third comparing circuit 309 are deleted from the configuration of FIG. 13, and the output of the second adding circuit 304 and the second signal 203 are outputted. Namely, the first signal 202 is the signal E, and the second signal 203 is the signal D. Further, the output (the third signal) of the second adding circuit is the signal H, and the second signal 203 is outputted as the signal G.

The second correction means 2603 is different from the configuration of FIG. 13 in that the carrier, the second comparing circuit 308, and the third comparing circuit 309 are deleted, and the output (the third signal) of the second adding circuit 304 and the second signal are outputted as the outputs of this second correction means 2603. Namely, the first signal 202 is the signal F, and the second signal 203 is the signal H. And, the output of the second adding circuit 304 is the signal J, and the second signal is outputted as the signal I.

By employing thus-described configuration, the third and fourth signals of FIG. 13 correspond to the signals G and H, respectively. Accordingly, the difference between the signal G and the signal H becomes larger than or equal to the reference value, similarly to the pulse signal difference 213 of FIG. 14. The signal H and the signal I are same and not corrected, and thus, also the difference between the signal G and the signal I becomes larger than or equal to the reference value, similarly to the relation between the signal G and the signal H. Further, also the difference between the signal I and the signal J becomes larger than or equal to the reference value.

Since the first rearranging means 2601 rearranges the signals in the ascending order, a difference of another combination, i.e., the difference between the signal G and the signal J becomes larger than or equal to the reference value. Then, the signals G, I and J are rearranged by the rearranging means 2604 such that the signal B and the signal C correspond to the signal L and the signal M, respectively. Further, the comparing means 2605 compares the rearranged signals with the carrier and performs the pulse width modulation. As a result, with respect to three signals N, O and P obtained by the pulse width modulation, it is ensured that a difference of any two signals has pulses each having a pulse width larger than or equal to the required pulse width.

Further the integrated errors included in the first correction means 2602 and the second correction means 2603 may be provided independently for each of the combinations of the signals A and D, the signals B and E, the signals C and F, etc. For example, with respect to the signals A and B, it is sufficient to provide a means for storing six relations between the signals A and D, the signals B and E, the signals B and F, etc., in total. By this arrangement, even when the order of the magnitudes of the signals A, B and C changes, smooth switching is realized.

Figure 16:
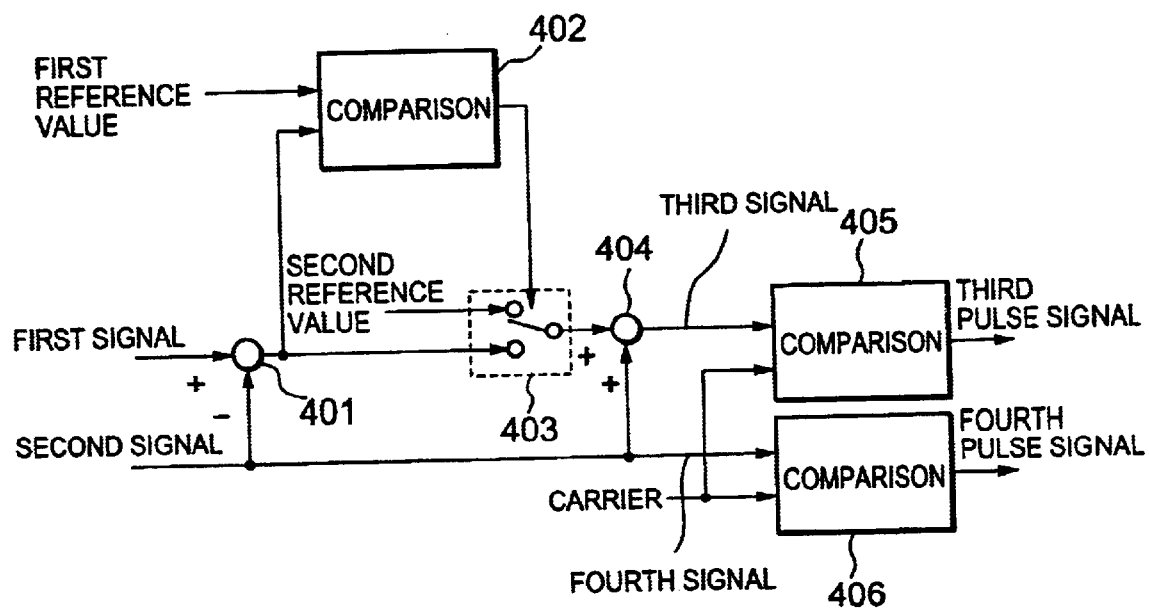
FIG. 16 is a schematic diagram showing a pulse width modulator according to a fifth embodiment of the present invention.

Next, a fifth embodiment of the present invention will be described. FIG. 16 shows a configuration of a pulse width modulator according to the fifth embodiment. In the present embodiment, the first and second signals are subjected to pulse width modulation, and the third and fourth pulse signals are outputted.

As shown in FIG. 16, the pulse width modulator according to the present embodiment comprises: an adding circuit 401 for obtaining a difference between the first and second signals; a first comparing circuit 402 for comparing a predetermined first reference value with the output (signal difference) of the adding circuit 401; a switching circuit 403 that outputs a second reference value larger than or equal to the first reference value when a comparison result of the first comparing circuit 402 is "the output of the adding circuit 401 is less than or equal to the reference value", and outputs the output signal of the adding circuit 401 when the comparison result of the first comparing circuit 402 is "the output of the adding circuit 401 is larger than the reference value;

a second adding circuit 404 for adding the second signal to the output of the switching circuit 403; a second comparing circuit 405 for performing the pulse width modulation by comparing the carrier with the output of the adding circuit 404; and a third comparing circuit 406 for performing the pulse width modulation by comparing the carrier with the second signal.

Namely, the means for obtaining a difference between two signals is implemented by the adding circuit 401, and the first comparing circuit 402, the switching circuit 403 and the second adding circuit 404 implement a means for correcting the mentioned signals such that the difference between the mentioned two signals becomes larger than or equal to a predetermined value when the signal difference is less than the mentioned predetermined value.

Figure 17:
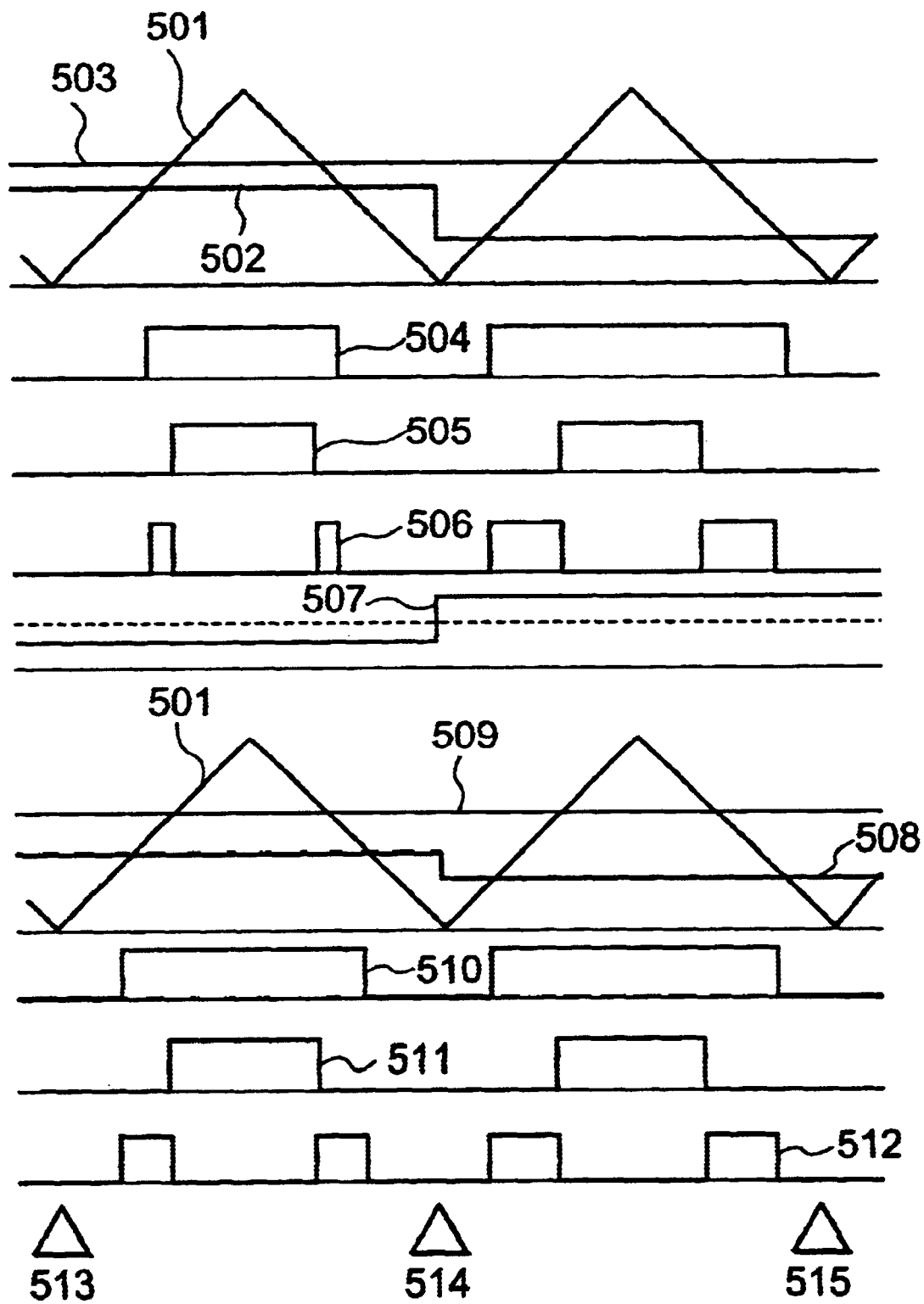
FIG. 17 is a waveform chart showing operation of a power converter according to the fifth embodiment of the present invention.

FIG. 17 shows waveforms of the signals in the pulse width modulator of FIG. 16. In FIG. 17, the reference numeral 501 refers to the carrier for performing the pulse width modulation; 502 to the first signal, 503 to the second signal; 504 to a first pulse signal obtained by performing the pulse width modulation on the first signal 502 according to the conventional technique; 505 to a second pulse signal obtained by performing the pulse width modulation on the second signal 503 according to the conventional technique; and 506 to a first pulse difference, i.e., a difference between the first pulse signal and the second pulse signal. Here, the waveforms 504, 505 and 506 are added for comparing the pulse width modulation system according to the present embodiment and the conventional pulse width modulation system, and those signals are not included in the pulse width modulator according to the present embodiment.

Further, the reference numeral 507 refers to a signal difference obtained by adding an integrated error to the difference between the first and second signals as the output of the first adding circuit 401; 508 to the output of the second adding circuit 404, i.e., a third signal obtained by correcting the first signal 502 in the present embodiment; 509 to a fourth signal obtained by correcting the second signal 503 in the present embodiment; 510 to a third pulse signal obtained by performing the pulse width modulation on the third signal as the output of the second comparing circuit 405; 511 to a fourth pulse signal obtained by the pulse width modulation on the fourth signal as the output of the third comparing circuit 406; 512 to a second pulse signal difference, i.e., a difference between the third and fourth pulse signals; 513 to a first time showing a point for processing; 514 to a second time showing another point for processing; and 515 to a third time showing still another point for processing.

When the first signal 502 and the second signal 503 are compared in their magnitudes with the carrier 501, the first pulse signal 504 and the second pulse signal 505 are respectively obtained by the conventional system. The difference between the first pulse signal 504 and the second pulse signal 505 becomes the first pulse signal difference 506. Thus, in the example shown in FIG. 17, the pulse difference having narrower pulse widths is obtained in the period between the first time 513 and the second time 514. On the other hand, the result of the present embodiment is as follows.

In the period between the first time 513 and the second time 514, the difference between the first signal 502 and the second signal 503 is obtained as the signal difference 507. Next, the first and second signals 502 and 503 are corrected to obtain the third and fourth signals 508 and 509, respectively. Since the signal difference 507 is less than the predetermined value shown by the dotted line, the switching circuit 403 outputs the second reference value, and the second adding circuit 404 adds the second reference value and the second signal to output the result.

Thus, the first signal 502 is corrected to become the second reference value that is larger than or equal to the first reference value, and the difference between the third signal 508 and the fourth signal 509 becomes the third signal 508. Here, the correction is performed on the basis of the second signal 503, the fourth signal 509 is same as the second signal 503. Further, by comparing the third signal 508 and the fourth signal 509 in their magnitudes with the carrier 501, the third pulse signal 510 and the fourth pulse signal 511 are obtained, respectively. And, the difference between the third pulse signal 510 and the fourth pulse signal 511 becomes the second pulse signal difference 512.

Next, the period between the second time 514 and the third time 515 will be described. In this period, although the pulse width obtained in the first pulse signal difference 506, even in the conventional system, becomes wider than the required pulse width, the result of the present embodiment becomes as follows.

In this period, the signal difference 507 is larger than or equal to the predetermined value shown by the dotted line. Accordingly, the switching circuit 403 outputs the output of the first adding circuit 401. The second adding circuit 404 adds the output of the first adding circuit 401 and the second signal, and outputs the first signal 502. Thus, the first signal 502 as it is becomes the third signal 508. Further, the correction is performed on the basis of the second signal 503, the fourth signal 509 is same as the second signal 503.

By comparing the second pulse difference 512 obtained by performing the correction according to the present embodiment with the first pulse signal difference 506 obtained by the conventional system, it is seen that, in the present embodiment, pulses outputted between the first time 513 and the second time 514 are corrected to ensure the required pulse width. Further, with respect to pulses outputted between the second time 514 and the third time 515 in which correction is not required, the second pulse signal difference 512 is same as the first pulse signal difference 506.

The above-described fifth embodiment takes an example that the number of signals is two. However, similarly to the fourth embodiment, when there exist three or more signal, it is possible to rearrange those signals in the order of magnitude, to sequentially apply the above means to each two adjacent signals. For example, when there exist three signals, the above-described means may be applied to the first correction means 2602 and the second correction means 2603 in the pulse width modulator shown in FIG. 15, as described in the following.

Namely, the configuration of the first correction means 2602 differs from the configuration shown in FIG. 16 in that the carrier, the second comparing circuit 405 and the third comparing circuit 406 are deleted, and the output of the second adding circuit 404 and the second signal 503 are outputted. The first signal 502 is the signal E, and the second signal 503 is the signal D. And, the output of the second adding circuit 404 is the signal H, and the second signal 503 is outputted as the signal G.

Further, the configuration of the second correction means 2603 differs from the configuration shown in FIG. 16 in that the carrier, the second comparing circuit 405 and the third comparing circuit 406 are deleted, and the output of the second adding circuit 404 and the second signal 503 are outputted. The first signal 502 is the signal F, and the second signal 503 is the signal H. And, the output of the second adding circuit 404 is the signal J, and the second signal 503 is outputted as the signal I.

By employing the above-described configuration, the difference between the signals G and H becomes larger than or equal to the reference value as described above, and the signals H and I are not corrected, and accordingly the difference between the signals G and I becomes larger than or equal to the reference value as described above. Further, also the difference between the signals I and J becomes larger than or equal to the reference value. Since the first rearranging means 2601 rearranges the signals in the ascending order, also the difference of another combination of signals, i.e., the difference between the signals G and J becomes larger than or equal to the reference value. Then, the signals G, I and J are rearranged by the rearranging means 2604 such that the signal A corresponds to the signal K, the signal B to the signal L, and the signal C to the signal M. Further, the comparing means 2605 compares the rearranged signals with the carrier and performs the pulse width modulation. As a result, with respect to the signals N, O and P obtained by the pulse width modulation, it is ensured that a difference of any two signals has pulses each having a pulse width larger than or equal to the required pulse width.

Further, instead of the PWM control unit shown in FIG. 2, the pulse width modulator shown in FIG. 15 can be applied to the power converter shown in FIG. 12. In the power converter to which the pulse width modulator shown in FIG. 15 is applied, the voltage commands Eu, Ev and Ew are inputted respectively as the signals A, B and C i.e., inputs to the pulse width modulator. Further, its outputs, i.e. the signals N, O and P are outputted as the gate signals Gu, Gv and Gw, and the signals N, O and P are reversed and outputted as the gate signals Gx, Gy and Gz.

According to the above-described embodiments of the present invention, when the pulse width modulation is performed on a plurality of signals, a signal difference between signals becomes larger than or equal to the minimum pulse width, and thus the required pulse width can be ensured. Further, when a signal difference is less than the minimum pulse width, output is not given, and an error is integrated. Thus, the width difference average of the outputted pulses does not change.

Further, when the difference of the above-mentioned signals lies in the neighborhood of zero, the frequency of the carrier becomes lower. Thus, even in an area in which the pulse width becomes narrower, the required pulse width can be ensured.

Further, according to the power converter to which the above-described pulse width modulation system is applied, it is possible to ensure periods for sampling the DC current Idc, and at the same time, to improve the motor control performance.

What is claimed is:

1. A method of pulse width modulation of a plurality of signals, comprising:
    obtaining signal differences, each of which is a difference between two signals from said plurality of signals; and
    correcting said plurality of signals such that widths of all pulses obtained based on the signal differences from said plurality of signals become larger than or equal to a predetermined value given in advance.

2. A method of pulse width modulation of a plurality of signals, comprising:
    obtaining a signal difference by adding an integrated error to a difference between two signals out of said plurality of signals;

when said signal difference is less than a predetermined value given in advance, correcting at least one of said two signals such that the difference between said two signals becomes zero or less than said signal difference; and when said signal difference is larger than or equal to the predetermined value, correcting at least one of said two signals such that the difference between said two signals becomes said signal difference.

3. A method of performing pulse width modulation on a plurality of signals, using a carrier, comprising:

obtaining signal differences, each of which is a difference between two signals out of said plurality of signals; and when at least one of said signal differences is zero or less than a predetermined value given in advance, lowering a frequency of said carrier.

4. A pulse width modulator that for performing pulse width modulation on a plurality of signals, comprising:

means for obtaining a signal difference which is a difference between two signals out of said plurality of signals; and means for correcting the difference between said two signals larger than or equal to a predetermined value given in advance, when said signal difference is less than said predetermined value.

5. A pulse width modulator for performing pulse width modulation on a plurality of signals, comprising:

means for obtaining a signal difference by adding an integrated error to a difference between two signals out of said plurality of signals; and correction means for correcting the difference of said two signals to become zero or less than said signal difference and obtaining said integrated error from the corrected difference between said two signals and said signal difference when said signal difference is less than a predetermined value, and for correcting the difference of said two signals to become said signal difference and correcting said integrated error to be zero when said signal difference is larger than or equal to said predetermined value.

6. A pulse width modulator for performing pulse width modulation on three signals, comprising:

means for selecting a first signal whose magnitude is intermediate among the three signals;

means for obtaining a signal difference which is a difference between said first signal and one of other signals;

correction means for correcting one of said first signal and said one of the other signals when said signal difference is less than a predetermined value given in advance, such that the difference between said one of the other signals and said first signal becomes larger than or equal to said predetermined value, to obtain the first signal after correction and said one of the other signals after correction.

7. A pulse width modulator for performing pulse width modulation on three signals, comprising:

means for selecting a first signal whose magnitude is intermediate among the three signals;

means for obtaining a signal difference by adding an integrated error to a difference between said first signal and one of the other signals;

means for obtaining one of said first signal after correction and said one of the signals after correction by correcting one of said first signal and said one of the other signals such that the difference between said first signal and said one of the other signals becomes zero or less than said signal difference when said signal difference is less than a predetermined value given in advance; and means for obtaining said integrated error based on the difference between said first signal after correction and said one of the other signals after correction, and said signal difference.

8. A pulse width modulator for performing pulse width modulation on a plurality of signals, using a carrier, comprising:

means for obtaining a difference between low-frequency components of two signals out of said plurality of signals; and means for lengthening pulse intervals of said carrier, when the difference between low-frequency components of said two signals out of said plurality of signals is zero or less than a predetermined value given in advance.

9. The pulse width modulator according to claim 8, wherein the pulse intervals of said carrier are lengthened when a frequency of said carrier is lowered.

10. A power converter to control operation of a motor, comprising:

means for receiving a DC voltage from a power supply;

a plurality of switching elements arranged to convert the DC voltage into multi-phase voltages connected to the motor; and a pulse width modulation system arranged to perform pulse width modulation on a plurality of signals to be used as voltage commands, and to control operations of the switching elements to output pulse voltages based on the voltage commands, said pulse width modulation system comprising:

means for obtaining signal differences each of which is a difference between two signals out of said plurality of signals; and means for correcting said plurality of signals such that pulse widths obtained based on the signal differences from said plurality of signals become larger than or equal to a predetermined value.

11. A power converter to control operation of a motor, comprising:

means for receiving a DC voltage from a power supply;

a plurality of switching elements arranged to convert the DC voltage into multi-phase voltages connected to the motor; and a pulse width modulation system arranged to perform pulse width modulation on a plurality of signals to be used as voltage commands, and to control operations of the switching elements to output pulse voltages based on the voltage commands, said pulse width modulation system comprising:

means for obtaining a signal difference by adding an integrated error to a difference between two signals out of said plurality of signals; and means for correcting at least one of said two signals such that the difference between said two signals becomes zero or less than said signal difference when said signal difference is less than a predetermined value, and for correcting at least one of said two signals such that the difference between said two signals becomes said signal difference when said signal difference is larger than or equal to said predetermined value.

12. A power converter to control operation of a motor, comprising:

means for receiving a DC voltage from a power supply;

a plurality of switching elements arranged to convert the DC voltage into multi-phase voltages connected to the motor; and a pulse width modulation system arranged to perform, in accordance with a carrier, pulse width modulation on a plurality of signals to be used as voltage commands, and to control operations of the switching elements to output pulse voltages based on the voltage commands, said pulse width modulation system comprising:

means for obtaining signal differences each of which is a difference between two signals out of said plurality of signals; and means for lowering a frequency of said carrier, when at least one of said signal differences is zero or less than a predetermined value.

13. A power converter to control operation of a motor, comprising:

means for receiving a DC voltage from a power supply;

a plurality of switching elements arranged to convert the DC voltage into multi-phase voltages connected to the motor; and a pulse width modulation system arranged to perform pulse width modulation on a plurality of signals to be used as voltage commands, and to control operations of the switching elements to output pulse voltages based on the voltage commands, said pulse width modulation system comprising:

means for obtaining a signal difference which is a difference between two signals out of said plurality of signals; and means for correcting the difference between said two signals larger than or equal to a predetermined value, when said signal difference is less than said predetermined value.

14. A power converter to control operation of a motor, comprising:

means for receiving a DC voltage from a power supply;

a plurality of switching elements arranged to convert the DC voltage into multi-phase voltages connected to the motor; and a pulse width modulation system arranged to perform pulse width modulation on a plurality of signals to be used as voltage commands, and to control operations of the switching elements to output pulse voltages based on the voltage commands, said pulse width modulation system comprising:

means for obtaining a signal difference by adding an integrated error to a difference between two signals out of said plurality of signals; and means for correcting the difference between said two signals to become zero or less than said signal difference and obtaining said integrated error from the corrected difference between said two signals and said signal difference when said signal difference is less than a predetermined value, and for correcting the difference between said two signals to become said signal difference and correcting said integrated error to be zero when said signal difference is larger than or equal to said predetermined value.

15. A power converter to control operation of a motor, comprising:

means for receiving a DC voltage from a power supply;

a plurality of switching elements arranged to convert the DC voltage into multi-phase voltages connected to the motor; and a pulse width modulation system arranged to perform pulse width modulation on three signals to be used as voltage commands, and to control operations of the switching elements to output pulse voltages based on the voltage commands, said pulse width modulation system comprising:

means for selecting a first signal whose magnitude is intermediate among the three signals;

means for obtaining a signal difference which is a difference between said first signal and one of other signals; and correction means for correcting one of said first signal and said one of the other signals when said signal difference is less than a predetermined value, such that the difference between said one of said first signal and said one of the other signals becomes larger than or equal to said predetermined value, to obtain said first signal after correction and said one of the other signals after correction.

16. A power converter to control operation of a motor, comprising:

means for receiving a DC voltage from a power supply;

a plurality of switching elements arranged to convert the DC voltage into multi-phase voltages connected to the motor; and a pulse width modulation system arranged to perform pulse width modulation on three signals to be used as voltage commands, and to control operations of the switching elements to output pulse voltages based on the voltage commands, said pulse width modulation system comprising:

means for selecting a first signal whose magnitude is intermediate among the three signals;

means for obtaining a signal difference by adding an integrated error to a difference between said first signal and one of other signals;

means for correcting one of said first signal and said one of the other signals such that the difference between said one of said first signal and said one of the other signals becomes zero or less than a predetermined value when said signal difference is less than said predetermined value, to obtain said first signal after correction and said one of the other signals after correction; and means for obtaining said integrated error based on the difference between said first signal after correction and said one of the other signals after correction, and said signal difference.

17. A power converter to control operation of a motor, comprising:

means for receiving a DC voltage from a power supply;

a plurality of switching elements arranged to convert the DC voltage into multi-phase voltages connected to the motor; and a pulse width modulation system arranged to perform, in accordance with a carrier, pulse width modulation on a plurality of signals to be used as voltage commands, and to control operations of the switching elements to output pulse voltages based on the voltage commands, said pulse width modulation system comprising:

means for obtaining a difference between low-frequency components of two signal out of said plurality of signals; and means for lengthening pulse intervals of said carrier, when the difference between low-frequency components of said two signals out of said plurality of signals is zero or less than a predetermined value.

18. A power converter according to claim 17, wherein the pulse intervals of said carrier are lengthened when a frequency of said carrier is lowered.

* * * * *